United States Patent
Hanna et al.

(10) Patent No.: US 11,687,477 B2
(45) Date of Patent: *Jun. 27, 2023

(54) SIGNALING MECHANISM FOR BUS INVERSION

(71) Applicant: Micron Technology, Inc., Boise, ID (US)

(72) Inventors: Stephen D. Hanna, Fort Collins, CO (US); Jonathan S. Parry, Boise, ID (US)

(73) Assignee: Micron Technology, Inc., Boise, ID (US)

( * ) Notice: Subject to any disclaimer, the term of this patent is extended or adjusted under 35 U.S.C. 154(b) by 0 days.

This patent is subject to a terminal disclaimer.

(21) Appl. No.: 17/573,214

(22) Filed: Jan. 11, 2022

(65) Prior Publication Data

US 2022/0206981 A1    Jun. 30, 2022

Related U.S. Application Data

(63) Continuation of application No. 16/942,564, filed on Jul. 29, 2020, now Pat. No. 11,294,838.

(51) Int. Cl.
  *G06F 13/40*  (2006.01)
  *G06F 1/26*   (2006.01)

(52) U.S. Cl.
  CPC ............. *G06F 13/40* (2013.01); *G06F 1/266* (2013.01)

(58) Field of Classification Search
  CPC .................................. G06F 13/40; G06F 1/266
  See application file for complete search history.

(56) References Cited

U.S. PATENT DOCUMENTS

| | | | |
|---|---|---|---|
| 6,584,526 B1 | 6/2003 | Bogin et al. | |
| 10,861,508 B1 | 12/2020 | Mathur et al. | |
| 11,294,838 B2 * | 4/2022 | Hanna | G06F 1/266 |
| 2003/0158981 A1 | 8/2003 | Laberge | |
| 2007/0038789 A1 | 2/2007 | Macri et al. | |
| 2009/0313521 A1 | 12/2009 | Hollis | |
| 2010/0005373 A1 * | 1/2010 | Bisen | G06F 13/4234 714/E11.03 |
| 2013/0227210 A1 | 8/2013 | Walker | |
| 2015/0095684 A1 * | 4/2015 | Haraguchi | G06F 1/3275 713/323 |
| 2015/0227417 A1 | 8/2015 | Kim | |
| 2015/0287446 A1 | 10/2015 | Hong | |

(Continued)

OTHER PUBLICATIONS

International Search Report and Written Opinion received for PCT Patent Application No. PCT/US21/42338, dated Oct. 22, 2021, 12 pages.

*Primary Examiner* — Phong H Dang
(74) *Attorney, Agent, or Firm* — Holland & Hart LLP

(57) ABSTRACT

Methods, systems, and devices that support signaling mechanisms for bus inversion are described. A control signal that supports transferring information from a first controller to a second controller via a bus may also be configured to indicate whether or not data that is communicated over the bus is inverted. The control signal may be a control signal that enables reception of control information at the second controller. The control signal may be controlled by the first controller when data is transmitted to the second controller and may be controlled by the second controller when data is transmitted to the first controller.

20 Claims, 9 Drawing Sheets

(56) References Cited

U.S. PATENT DOCUMENTS

| | | |
|---|---|---|
| 2018/0357188 A1 | 12/2018 | Brief |
| 2019/0079892 A1 | 3/2019 | Jung et al. |
| 2021/0012852 A1 | 1/2021 | Tanaka et al. |

* cited by examiner

SIGNALING MECHANISM FOR BUS INVERSION

CROSS REFERENCE

The present application for patent is a continuation of U.S. patent application Ser. No. 16/942,564 by Hanna et al., entitled "SIGNALING MECHANISM FOR BUS INVERSION," filed Jul. 29, 2020, assigned to the assignee hereof, and is expressly incorporated by reference in its entirety herein.

BACKGROUND

The following relates generally to one or more systems for memory and more specifically to signaling mechanism for bus inversion.

Memory devices are widely used to store information in various electronic devices such as computers, wireless communication devices, cameras, digital displays, and the like. Information is stored by programing memory cells within a memory device to various states. For example, binary memory cells may be programmed to one of two supported states, often denoted by a logic 1 or a logic 0. In some examples, a single memory cell may support more than two states, any one of which may be stored. To access the stored information, a component may read, or sense, at least one stored state in the memory device. To store information, a component may write, or program, the state in the memory device.

Various types of memory devices and memory cells exist, including magnetic hard disks, random access memory (RAM), read-only memory (ROM), dynamic RAM (DRAM), synchronous dynamic RAM (SDRAM), ferroelectric RAM (FeRAM), magnetic RAM (MRAM), resistive RAM (RRAM), flash memory, phase change memory (PCM), self-selecting memory, chalcogenide memory technologies, and others. Memory cells may be volatile or non-volatile. Non-volatile memory, e.g., FeRAM, may maintain their stored logic state for extended periods of time even in the absence of an external power source. Volatile memory devices, e.g., DRAM, may lose their stored state when disconnected from an external power source.

DETAILED DESCRIPTION

Figure 1:
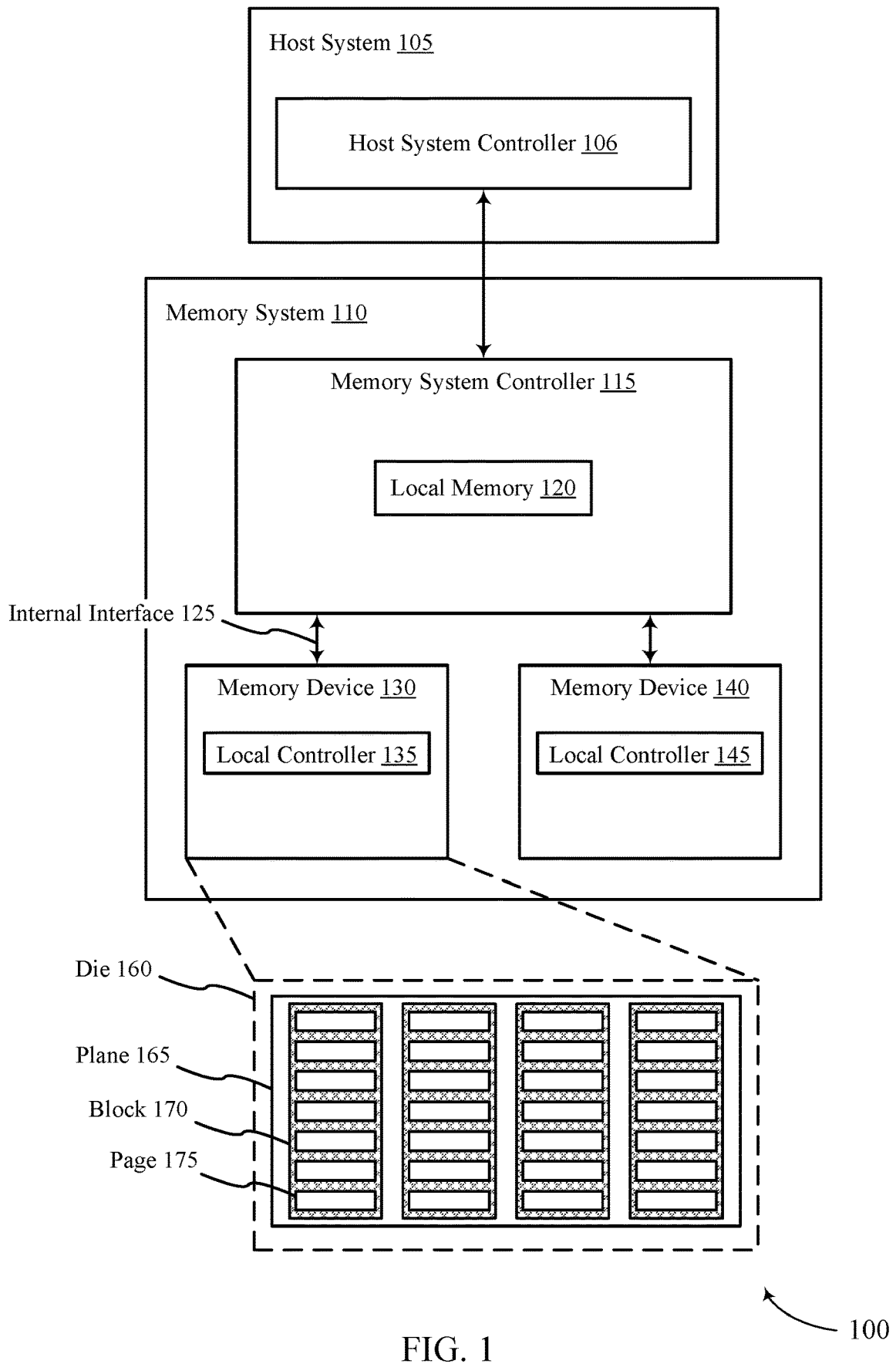
FIG. 1 illustrates an example of a system that supports signaling mechanisms for bus inversion in accordance with examples as disclosed herein.

Data may be communicated within memory system (e.g., a not-AND (NAND) memory system), which in some cases may alternatively be referred to as a memory sub-system. For example, data may be communicated between a system-level controller and a device-level controller for a device within the system via an internal interface (e.g., between a system-level NAND controller and a device-level or "local" NAND controller). The internal interface may be or include a bus for communicating information (e.g., control information and/or data). In some case, the internal interface may be in accordance with one or more standards or protocols, such as an open NAND flash interface (ONFI), as just one examples.

In some cases, control signals and data may be concurrently communicated over an interface. For example, a control signal may be used to enable the local NAND controller to receive commands and/or memory addresses that are transmitted over the bus by the system-level NAND controller. An amount of power consumed to communicate data over the bus may be based on a quantity of transitions (e.g., voltage transitions) that occur on the bus while the data is communicated. For example, the amount of consumed power may increase as the quantity of transitions increases.

A technique (which in some cases may be referred to as "data bus inversion" or "DBI") may be used to reduce the quantity of transitions that occur while communicating data over the interface, and thus, to reduce the amount of power consumed, by strategically inverting certain sets of data before communicating the sets of data over the interface. In some systems, to support the use of DBI over an interface, devices that communicate via the interface may each be configured with a pin that is dedicated to a control signal that supports DBI (which may be referred to as a DBI signal). For example, a DBI signal may indicate whether data that is communicated (e.g., exchanged) over the bus is or is not inverted. Along with dedicated DBI pins at the devices, the interface between the devices may be configured with a control line (e.g., trace or other signal path) that is dedicated to carrying the DBI signal. Further, the devices that communicate over the interface may also be configured with input and/or output buffers that support (e.g., are dedicated to) sending or receiving the DBI signal.

But for some memory systems, configuring additional pins at two or more devices (e.g., at a system-level controller and a local device-level controller) may increase a footprint of the devices and increase the complexity of manufacturing/assembly—e.g., by introducing additional bonding pads. Similarly, incorporating output and/or input buffers into the devices may increase a footprint of the devices and increase power consumption. Further, adding an additional control line to an interface may be incompatible with existing protocols established for communicating over the interface (e.g., may be incompatible with ONFI protocols). Additionally, or alternatively, adding an additional control line to an interface may increase a size of the interface and/or increase a complexity associated with routing the interface (e.g., with spatially arranging interconnects).

To achieve the benefits of DBI with minimal or no increase to a footprint of devices within a memory system and with minimal or no changes to existing specifications (e.g., interface protocols or standards), a control signal that is inactive during an access operation (e.g., a read or write operation) may be used to indicate whether a corresponding set of data communicated over an interface has been inverted. For example, a control signal that is configured to enable the reception of a command and/or memory address at a memory device (e.g., a NAND device) may be repurposed during a data transfer stage to indicate whether a set of data communicated over a corresponding interface has been inverted. In some examples, the control signal may be a bidirectional control signal based on whether data is being written to or read from the memory device—that is, the control signal may be controlled by either a local controller at the NAND device or by a system-level controller (e.g., a controller within the memory system that is coupled with a host device and one or more memory devices). By repurposing an existing control signal to convey a DBI signal during a data transfer stage, a footprint of the one or more memory devices within a memory system may be maintained and protocols for communicating with a memory device may be left minimally changed or unchanged.

Features of the disclosure introduced above may be performed alone or in combination with one another. Features of the disclosure introduced above are further described below in the context of a memory system. Specific examples are then described of timing diagrams that support signaling mechanisms for bus inversion. These and other features of the disclosure are further illustrated by and described with reference to apparatus diagrams, system diagrams, and flowcharts that relate to signaling mechanisms for bus inversion.

FIG. 1 is an example of a system 100 that supports signaling mechanisms for bus inversion in accordance with examples as disclosed herein. The system 100 includes a host system 105 coupled with a memory system 110.

A memory system 110 may be or include any device or collection of devices, where the device or collection of devices includes at least one memory array. For example, a memory system 110 may be or include a Universal Flash Storage (UFS) device, an embedded Multi-Media Controller (eMMC) device, a flash device, a universal serial bus (USB) flash device, a secure digital (SD) card, a solid-state drive (SSD), a hard disk drive (HDD), a dual in-line memory module (DIMM), a small outline DIMM (SO-DIMM), or a non-volatile DIMM (NVDIMM), among other possibilities.

The system 100 may be included in a computing device such as a desktop computer, a laptop computer, a network server, a mobile device, a vehicle (e.g., airplane, drone, train, automobile, or other conveyance), an Internet of Things (IoT) enabled device, an embedded computer (e.g., one included in a vehicle, industrial equipment, or a networked commercial device), or any other computing device that includes memory and a processing device.

The system 100 may include a host system 105, which may be coupled with the memory system 110. In some examples, this coupling may include an interface with a host system controller 106, which may be an example of a controller configured to cause the host system 105 to perform various operations in accordance with examples as described herein. The host system 105 may include one or more devices, and in some cases may include a processor chipset and a software stack executed by the processor chipset. For example, the host system 105 may include an application configured for communicating with the memory system 110 or a device therein. The processor chipset may include one or more cores, one or more caches (e.g., memory local to or included in the host system 105), a memory controller (e.g., NVDIMM controller), and a storage protocol controller (e.g., PCIe controller, serial advanced technology attachment (SATA) controller). The host system 105 may use the memory system 110, for example, to write data to the memory system 110 and read data from the memory system 110. Although one memory system 110 is shown in FIG. 1, it is to be understood that the host system 105 may be coupled with any quantity of memory systems 110.

The host system 105 may be coupled with the memory system 110 via at least one physical host interface. The host system 105 and the memory system 110 may in some cases be configured to communicate via a physical host interface using an associated protocol (e.g., to exchange or otherwise communicate control, address, data, and other signals between the memory system 110 and the host system 105). Examples of a physical host interface may include, but are not limited to, an ONFI interface, a SATA interface, a UFS interface, an eMMC interface, a peripheral component interconnect express (PCIe) interface, USB interface, Fiber Channel, Small Computer System Interface (SCSI), Serial Attached SCSI (SAS), Double Data Rate (DDR), a dual in-line memory module (DIMM) interface (e.g., DIMM socket interface that supports DDR), or a Low Power Double Data Rate (LPDDR) interface. In some examples, one or more such interfaces may be included in or otherwise supported between a host system controller 106 of the host system 105 and a memory system controller 115 of the memory system 110. In some examples, the host system 105 may be coupled with the memory system 110 (e.g., the host system controller 106 may be coupled with the memory system controller 115) via a respective physical host interface for each memory device 130 or memory device 140 included in the memory system 110, or via a respective physical host interface for each type of memory device 130 or memory device 140 included in the memory system 110.

Memory system 110 may include a memory system controller 115, a memory device 130, and a memory device 140. A memory device 130 may include one or more memory arrays of a first type of memory cells (e.g., a type of non-volatile memory cells), and a memory device 140 may include one or more memory arrays of a second type of memory cells (e.g., a type of volatile memory cells). Although one memory device 130 and one memory device 140 are shown in the example of FIG. 1, it is to be understood that memory system 110 may include any quantity of memory devices 130 and memory devices 140, and that, in some cases, memory system 110 may lack either a memory device 130 or a memory device 140.

The memory system controller 115 may be coupled with and communicate with the host system 105 (e.g., via the physical host interface), and may be an example of a controller configured to cause the memory system 110 to perform various operations in accordance with examples as described herein. The memory system controller 115 may also be coupled with and communicate with memory devices 130 or memory devices 140 to perform operations such as reading data, writing data, erasing data, or refreshing data at a memory device 130 or a memory device 140, and other such operations, which may generically be referred to as access operations. In some cases, the memory system controller 115 may receive commands from the host system 105 and communicate with one or more memory devices 130 or memory devices 140 to execute such commands (e.g., at memory arrays within the one or more memory devices 130 or memory devices 140). For example, the memory system controller 115 may receive commands or operations from the host system 105 and may convert the commands or operations into instructions or appropriate commands to achieve the desired access of the memory devices 130 or memory devices 140. And in some cases, the memory system controller 115 may exchange data with the host system 105 and with one or more memory devices 130 or memory devices 140 (e.g., in response to or otherwise in association with commands from the host system 105). For example, the memory system controller 115 may convert responses (e.g., data packets or other signals) associated with the memory devices 130 or memory devices 140 into corresponding signals for the host system 105.

The memory system controller 115 may be configured for other operations associated with the memory devices 130 or memory devices 140. For example, the memory system controller 115 may execute or manage operations such as wear-leveling operations, garbage collection operations, error control operations such as error-detecting operations or error-correcting operations, encryption operations, caching operations, media management operations, background refresh, health monitoring, and address translations between logical addresses (e.g., logical block addresses (LBAs)) associated with commands from the host system 105 and physical addresses (e.g., physical block addresses) associated with memory cells within the memory devices 130 or memory devices 140.

The memory system controller 115 may include hardware such as one or more integrated circuits or discrete components, a buffer memory, or a combination thereof. The hardware may include circuitry with dedicated (e.g., hard-coded) logic to perform the operations ascribed herein to the memory system controller 115. The memory system controller 115 may be or include a microcontroller, special purpose logic circuitry (e.g., a field programmable gate array (FPGA), an application specific integrated circuit (ASIC), a digital signal processor (DSP)), or any other suitable processor or processing circuitry.

The memory system controller 115 may also include a local memory 120. In some cases, the local memory 120 may include read-only memory (ROM) or other memory that may store operating code (e.g., executable instructions) executable by the memory system controller 115 to perform functions ascribed herein to the memory system controller 115. In some cases, the local memory 120 may additionally or alternatively include static random access memory (SRAM) or other memory that may be used by the memory system controller 115 for internal storage or calculations, for example, related to the functions ascribed herein to the memory system controller 115. Additionally, or alternatively, the local memory 120 may serve as a cache for the memory system controller 115. For example, data may be stored to the local memory 120 when read from or written to a memory device 130 or memory device 140, and may be available within the local memory 120 for subsequent retrieval for or manipulation (e.g., updating) by the host system 105 (e.g., with reduced latency relative to a memory device 130 or memory device 140) in accordance with a cache policy.

Although the example of memory system 110 in FIG. 1 has been illustrated as including the memory system controller 115, in some cases, a memory system 110 may not include a memory system controller 115. For example, the memory system 110 may additionally or alternatively rely upon an external controller (e.g., implemented by the host system 105) or one or more local controllers 135 or local controllers 145, which may be internal to memory devices 130 or memory devices 140, respectively, to perform the functions ascribed herein to the memory system controller 115. In general, one or more functions ascribed herein to the memory system controller 115 may in some cases instead be performed by the host system 105, a local controller 135, or a local controller 145, or any combination thereof.

A memory device 140 may include one or more arrays of volatile memory cells. For example, a memory device 140 may include random access memory (RAM) memory cells, such as dynamic RAM (DRAM) memory cells and synchronous DRAM (SDRAM) memory cells. In some examples, a memory device 140 may support random access operations (e.g., by the host system 105) with reduced latency relative to a memory device 130, or may offer one or more other performance differences relative to a memory device 130.

A memory device 130 may include one or more arrays of non-volatile memory cells. For example, a memory device 130 may include NAND (e.g., NAND flash) memory, ROM, phase change memory (PCM), self-selecting memory, other chalcogenide-based memories, ferroelectric RAM (FeRAM), magneto RAM (MRAM), Not-OR (NOR) (e.g., NOR flash) memory, Spin Transfer Torque (STT)-MRAM, conductive bridging RAM (CBRAM), resistive random access memory (RRAM), oxide based RRAM (OxRAM), and electrically erasable programmable ROM (EEPROM).

In some examples, a memory device 130 or a memory device 140 may include (e.g., on a same die or within a same package) a local controller 135 or a local controller 145, respectively, which may execute operations on one or more memory cells of the memory device 130 or the memory device 140. A local controller 135 or a local controller 145 may operate in conjunction with a memory system controller 115 or may perform one or more functions ascribed herein to the memory system controller 115. In some cases, a memory device 130 or a memory device 140 that includes a local controller 135 or a local controller 145 may be referred to as a managed memory device and may include a memory array and related circuitry combined with a local (e.g., on-die or in-package) controller (e.g., local controller 135 or local controller 145). An example of a managed memory device is a managed NAND (MNAND) device.

In some cases, a memory device 130 may be or include a NAND device (e.g., NAND flash device). A memory device 130 may be or include a memory die 160. For example, in some cases, a memory device 130 may be a package that includes one or more dies 160. A die 160 may, in some examples, be a piece of electronics-grade semiconductor cut from a wafer (e.g., a silicon die cut from a silicon wafer). Each die 160 may include one or more planes 165, and each plane 165 may include a respective set of blocks 170, where each block 170 may include a respective set of pages 175, and each page 175 may include a set of memory cells.

In some cases, a NAND memory device 130 may include memory cells configured to each store one bit of information, which may be referred to as single level cells (SLCs). Additionally, or alternatively, a NAND memory device 130 may include memory cells configured to each store multiple bits of information, which may be referred to as multi-level cells (MLCs) if configured to each store two bits of information, as tri-level cells (TLCs) if configured to each store three bits of information, as quad-level cells (QLCs) if configured to each store four bits of information, or more generically as multiple-level memory cells. Multiple-level memory cells may provide greater density of storage relative to SLC memory cells but may, in some cases, involve narrower read or write margins or greater complexities for supporting circuitry.

In some cases, planes 165 may refer to groups of blocks 170, and in some cases, concurrent operations may take place within different planes 165. For example, concurrent operations may be performed on memory cells within different blocks 170 so long as the different blocks 170 are in different planes 165. In some cases, performing concurrent operations in different planes 165 may be subject to one or more restrictions, such as identical operations being performed on memory cells within different pages 175 that have the same page address within their respective planes 165

(e.g., related to command decoding, page address decoding circuitry, or other circuitry being shared across planes 165).

In some cases, a block 170 may include memory cells organized into rows (pages 175) and columns (e.g., strings, not shown). For example, memory cells in a same page 175 may share (e.g., be coupled with) a common word line, and memory cells in a same string may share (e.g., be coupled with) a common digit line (which may alternatively be referred to as a bit line).

For some NAND architectures, memory cells may be read and programmed (e.g., written) at a first level of granularity (e.g., at the page level of granularity) but may be erased at a second level of granularity (e.g., at the block level of granularity). That is, a page 175 may be the smallest unit of memory (e.g., set of memory cells) that may be independently programmed or read (e.g., programmed or read concurrently as part of a single program or read operation), and a block 170 may be the smallest unit of memory (e.g., set of memory cells) that may be independently erased (e.g., erased concurrently as part of a single erase operation). Further, in some cases, NAND memory cells may be erased before they can be re-written with new data. Thus, for example, a used page 175 may in some cases not be updated until the entire block 170 that includes the page 175 has been erased.

Data may be communicated between a memory system controller 115 and a local controller 135 via an internal interface 125. Internal interface 125 may operate in accordance with a same or different protocol relative to the interface between memory system controller 115 and the host system controller 106. For example, internal interface 125 may be an ONFI interface. Internal interface 125 may include a bus and one or more control lines. The bus may be used to convey commands, memory addresses, and/or data between the memory system controller 115 and the local controller 135. Also, to support the communication of information (e.g., control information and/or data) over the internal interface 125, the control lines may be used to communicate control signals between the memory system controller 115 and the local controller 135. In some examples, the control lines may be operated in a unidirectional fashion. That is, a signal of a control line may be controlled (or driven) by one of the memory system controller 115 or the local controller 135.

The control signals transmitted over the control lines may include a chip enable (CE) signal, a command line enable (CLE) signal, an address line enable (ALE) signal, a write enable (WE) signal, a read enable (RE) signal, and a data strobe (DQS) signal. A CE signal may be transmitted by the memory system controller 115 and used to activate a memory device (e.g., the memory device 130). A CLE signal may be transmitted by the memory system controller 115 and used to indicate that a command is being transmitted over a bus of the internal interface 125. An ALE signal may be transmitted by the memory system controller 115 and used to indicate that a memory address is being transmitted over the bus. A WE signal may be transmitted by the memory system controller 115 and used in combination with a CLE and ALE signal to enable the reception of the commands and memory addresses being transmitted over the bus. The RE signal may be transmitted by the local controller 135 and used to enable memory system controller 115 to read data from memory device 130. The DQS signal may be used as a clock for the data being communicated (e.g., written to or read from memory device 130) over the bus.

As suggested above, one or more of the control signals may be used together (e.g., by the local controller 135) to trigger an operation (e.g., a read or write operation) at a memory device (e.g., the memory device 130). For example, the local controller 135 may be configured to receive a command on the bus when a received WE signal transitions from a low signal to a high signal while a received CLE signal is high. Similarly, the local controller 135 may be configured to receive a memory address on the bus when a received WE signal transitions from a low signal to a high signal while a received ALE signal is high.

In some examples, an amount of energy associated with communicating data over the bus of the internal interface 125 may be based on a content of the data. For example, the amount of energy may be based on a quantity of transitions (e.g., from 0 to 1 and vice versa) that occur while communicating the data over the bus. In some examples, the amount of consumed energy may increase as the quantity of transitions increase. To reduce the quantity of transitions that occur while communicating data over the bus, and thus, the amount of energy consumed, a set of data may be inverted before being communicated over the internal interface 125—e.g., so that the quantity of transitions that occur with respect to a previous set of data are reduced. Reducing the amount of energy consumed may be particularly beneficial in battery-power (e.g., mobile) environments. Techniques for determining whether to invert and, in some cases, inverting sets of data communicated over the interface may be referred to as DBI. In some examples, a set of data is to be inverted before being communicated over the bus based on a quantity of logic is included in the data—e.g., the set of data may be inverted if the quantity of logic 1s exceeds a threshold value. Additionally, or alternatively, a set of data may be inverted before being communicated over the bus based on a content of prior and/or future sets of data.

One approach to support DBI may be to add a dedicated DBI pin (which, as used herein, may generically refer to any conductive input or output point of a device that is couplable with an external signal path, examples of which may include pins, pads, or the like) at the memory system controller 115 and a corresponding dedicated DBI pin at the local controller 135 (e.g., at the memory device 130 that includes the local controller 135), and to add a control line that couples such DBI pins to internal interface 125, which may be referred to as a DBI line or DBI channel. Additionally, an output buffer may be added to memory system controller 115 and an input buffer added to local controller 135, with such buffers configured to support transmitting a DBI signal over the added control (DBI) line to indicate whether a corresponding set of data communicated over a data bus of the internal interface 125 has been inverted.

But configuring such additional pins at the memory system controller 115 and the local controller 135 may increase a footprint of the controllers and increase the complexity of manufacturing/assembly—e.g., by introducing additional bonding pads. Similarly, incorporating output and/or input buffers into the memory system controller 115 and the local controller 135 may increase a footprint of the controllers and increase power consumption. Including an additional control line in the interface may increase a size of the internal interface and/or increase a complexity associated with routing the interface. Moreover, introducing an additional control signal and control line may be incompatible with existing protocols established for communicating over the internal interface (e.g., may be incompatible with ONFI protocols). That is, before the additional control signal may be utilized, additions to the existing specification may be determined.

To achieve the benefits of DBI with minimal or no increase to a footprint of the controllers and with minimal or no changes to existing specifications, a control signal that is inactive during an access operation (e.g., a read or write operation) may be used to indicate whether a corresponding set of data communicated over an internal interface has been inverted. In some examples, a control signal that is configured to enable the reception of a command and/or memory address at a local controller 135 may be repurposed during a data transfer stage to indicate whether a corresponding set of data communicated over an internal interface has been inverted. In some examples, the control signal may be a bidirectional control signal based on whether data is being written to or read from a NAND memory device—that is, the control signal may be controlled by either the memory system controller 115 or the local controller 135. By repurposing an existing control signal to convey a DBI signal during a data transfer stage, a footprint of the memory system controller 115 and the local controller 135 may be maintained and protocols for communicating over an internal interface may be left minimally changed or unchanged.

Although discussed in the context of internal interface 125, DBI and the enhanced techniques for supporting DBI may be used with respect to any interface between any set of components (e.g., a physical host interface).

The system 100 may include any quantity of non-transitory computer readable media that support signaling mechanisms for bus inversion. For example, the host system 105, the memory system controller 115, a memory device 130, or a memory device 140 may include or otherwise may access one or more non-transitory computer readable media storing instructions (e.g., firmware) for performing the functions ascribed herein to the host system 105, memory system controller 115, memory device 130, or memory device 140. For example, such instructions, when executed by the host system 105 (e.g., by the host system controller 106), by the memory system controller 115, by a memory device 130 (e.g., by a local controller 135), or by a memory device 140 (e.g., by a local controller 145), may cause the host system 105, memory system controller 115, memory device 130, or memory device 140 to perform one or more associated functions as described herein.

Figure 2:
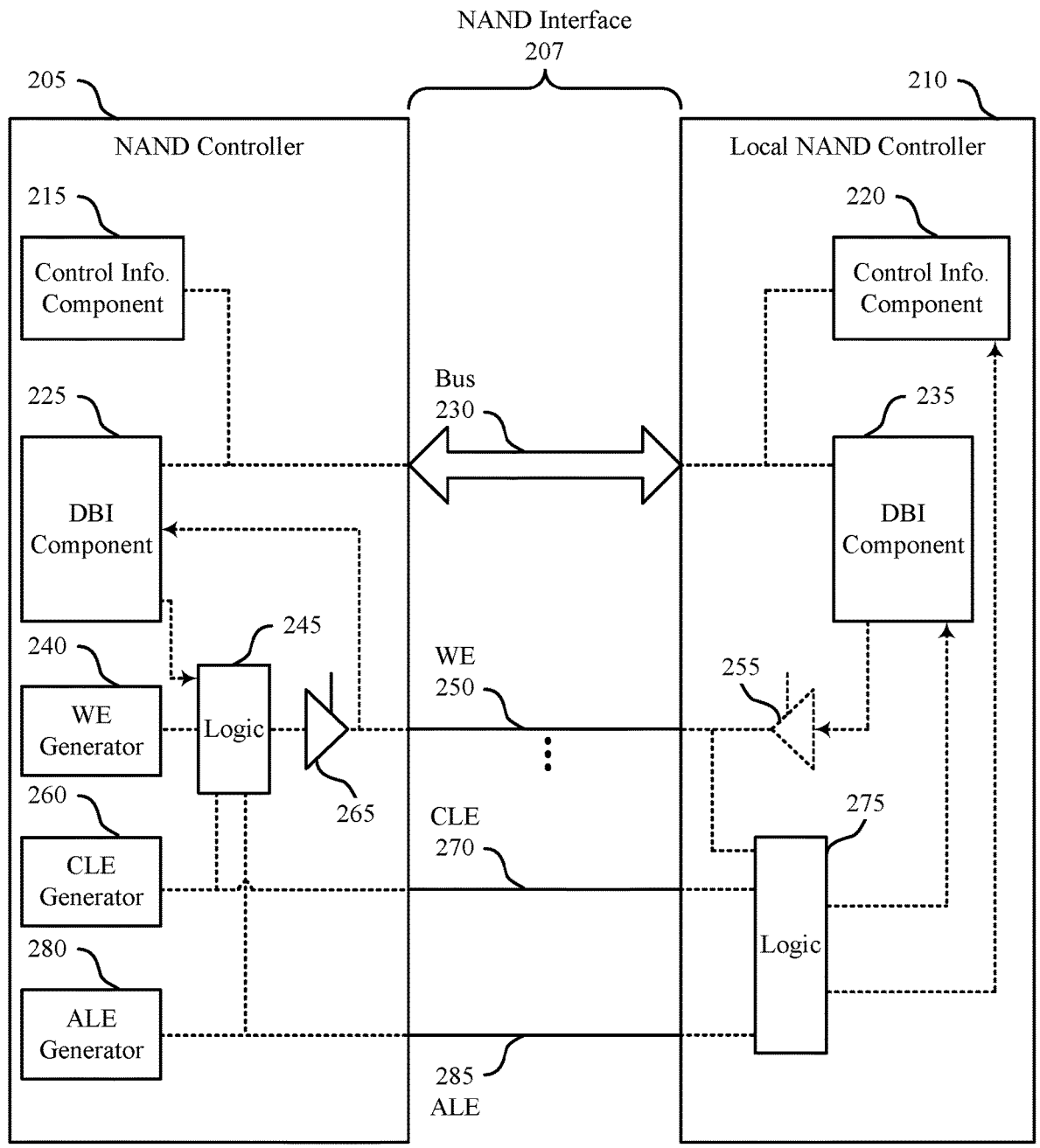
FIG. 2 illustrates an example of a memory system that supports signaling mechanism for bus inversion in accordance with examples as disclosed herein.

FIG. 2 illustrates an example of a memory system that supports signaling mechanism for bus inversion in accordance with examples as disclosed herein.

Memory system 200 may be configured to achieve the benefits of DBI with minimal to no increase in size relative to similar memory systems that do not use DBI. Memory system 200 may also be configured to be operated with minimal to no changes in existing protocols for operating similar memory systems. When no changes to existing protocols are made, a memory device may be operated (e.g., by a NAND controller) using the existing protocols while additional functionality may be unlocked by an operator through minor deviations from existing protocols that are compatible with the existing protocols. Memory system 200 may include a NAND controller 205, a local NAND controller 210, and NAND interface 207. Memory system 200 may be an example of aspects of memory system 110 of FIG. 1.

NAND controller 205 may be configured to generate and provide control information (e.g., commands and memory addresses) to a memory device in response to a request from a host system—e.g., in response to a request to store data in a NAND memory device or access data stored in a NAND memory device. NAND controller 205 may also be configured to provide data to a memory device and retrieve data from a memory device in response to a request from a host system. NAND controller 205 may be an example of a memory system controller 115 of FIG. 1.

Local NAND controller 210 may be configured to operate a memory device that is coupled with local NAND controller 210. For example, local NAND controller 210 may be configured to translate commands and memory addresses received from NAND controller 205 into modified commands and/or modified memory addresses (e.g., physical memory addresses) that are compatible with (e.g., used to operate) the coupled memory device. Local NAND controller 210 may be an example of local controller 135 of FIG. 1. Local NAND controller 210 may include local controller 220, local DBI component 235, local buffer 255, and local logic 275.

NAND interface 207 may be configured to convey information (e.g., control information and data) between NAND controller 205 and local NAND controller 210. NAND interface 207 may be configured to communicate data in accordance with a communication protocol. For example, NAND interface 207 may be configured to communicate data using an open NAND protocol, and may be referred to as an ONFI.

NAND controller 205 may include controller 215, DBI component 225, logic 245, buffer 265, WE signal generator 240, CLE signal generator 260, and an ALE signal generator 280.

Controller 215 may be configured to generate control information for accessing a memory device in response to a request received from a host device. Controller 215 may be configured to generate commands (e.g., read commands, program commands, erase commands, etc.) based on the received requests. Controller 215 may also be configured to generate one or more memory addresses that correspond to one or more of the commands. Controller 215 may be configured to transmit the commands and/or memory addresses over bus 230.

DBI component 225 may be configured to determine whether to invert a set of data that is to be transmitted over bus 230 from NAND controller 205. In some examples, DBI component 225 may invert a set of data based on determining that a quantity of logic 1s included in the set of data exceeds a threshold. In other examples, DBI component 225 may invert a set of data based on comparing the set of data with a previous set of data and determining that a quantity of transitions will be reduced if the set of data is inverted. DBI component 225 may also be configured to generate a control signal (a DBI signal) that indicates whether a corresponding set of data to be transmitted over bus 230 was inverted prior to being transmitted over bus 230 from NAND controller 205. DBI component 225 may be configured to send the DBI signal to logic 245. DBI component 225 may also be configured to determine whether a set of data that is received over bus 230 was inverted prior to being transmitted from local NAND controller 210—e.g., based on a DBI indication received in a WE signal transmitted over WE line 250.

In some examples, all or a portion of DBI component 225 may be external to NAND controller 205. For example, DBI component 225 may be implemented as an external hardware component that is positioned between NAND controller 205 and bus 230. Similarly, logic 245 and buffer 265 may be positioned external to NAND controller 205. In some examples, DBI component 225 may be implemented as software within NAND controller 205. In such cases, DBI component 225 may modify data within NAND controller 205 before the data is transmitted from NAND controller 205 over NAND interface 207. For example, if NAND controller 205 receives a data set represented in hexadecimal as AA55, DBI component 225 may invert a portion of the data set and append a DBI indicator to each inverted portion—e.g., DBI component 225 may output a modified data set represented in hexadecimal as 5(0)5(0)5(1)5(1), where the values within the parenthesis indicate whether a portion of the data set has been inverted.

Logic 245 may be configured to relay either a received DBI signal or a received WE signal to local NAND controller 210 via buffer 265. In some examples, logic 245 may be configured to select (e.g., using a multiplexer) one of the DBI signal or the WE signal based on a CLE signal and/or an ALE signal. In other examples, logic 245 may include combinatorial logic (e.g., an AND gate) that is used to relay the WE signal when the DBI signal is high and to relay the DBI signal when the DBI signal is low.

Buffer 265 may be configured to transmit a WE/DBI signal over WE line 250 from NAND controller 205. Buffer 265 may be a tri-state buffer, and thus, an output of buffer 265 may be configured in a floating state based on a voltage applied to a control line that is coupled with buffer 265. In some examples, an output of buffer 265 may be read by DBI component 225 to determine whether data transmitted over bus 230 from local NAND controller 210 was inverted prior to transmission. Thus, buffer 265 may serve the purpose of an output buffer and an input buffer.

WE signal generator 240 may be configured to generate a WE signal that enables local NAND controller 210 to receive a command and/or memory address that is stored on bus 230. In some examples, the WE signal may be a static high signal and may be represented as (WE #). That is, the WE signal may naturally have a high voltage and an active operation (e.g., the application of a voltage) may be used to pull down the voltage of the WE signal. WE signal generator 240 may send the WE signal to logic 245.

CLE signal generator 260 may be configured to generate a CLE signal that indicates a command is being communicated over bus 230. CLE signal generator 260 may send the CLE signal to logic 245 and transmit the CLE signal over CLE line 270. In some cases, CLE signal generator 260 is coupled with an output buffer that is configured to transmit the CLE signal over CLE line 270.

ALE signal generator 280 may be configured to generate an ALE signal that indicates a memory address is being communicated over bus 230. ALE signal generator 280 may send the ALE signal to logic 245 and transmit the ALE signal over ALE line 285. In some cases, ALE signal generator 280 is coupled with an output buffer that is configured to transmit the ALE signal over ALE line 285.

Local controller 220 may be configured to receive and process control information (e.g., commands and/or memory addresses) received from NAND controller 205. Local controller 220 may be configured to read control information on bus 230 based on one or more control signals received from NAND controller 205. For example, local controller 220 may be configured to determine that a command is present on bus 230 based on a CLE signal having a logic state (e.g., a high logic state) and may further be configured to process the command based on detecting a rising edge of a WE signal. In a similar example, local controller 220 may be configured to determine that a memory address is present on bus 230 based on an ALE signal having a logic state (e.g., a high logic state) and may further be configured to process the memory address based on detecting a rising edge of a WE signal. Local controller 220 may be configured to use the control information to trigger one or more actions at a memory device that execute a requested operation.

Local DBI component 235 may be configured to determine whether data received over bus 230 was inverted prior to being transmitted from NAND controller 205—e.g., based on a DBI indication received over WE line 250 and a CLE signal received over a CLE line 270 and/or ALE signal received over an ALE line 285. For example, local DBI component 235 may determine that data received over bus 230 was inverted based on determining that a WE signal received over WE line 250 has a low voltage while the CLE signal and the ALE signal have low voltages.

Local DBI component 235 may also be configured to determine whether to invert a set of data that is to be transmitted over bus 230 from local NAND controller 210. In some examples, local DBI component 235 may invert a set of data based on determining that a quantity of logic is included in the set of data exceeds a threshold. In other examples, local DBI component 235 may invert a set of data based on comparing the set of data with a previous set of data and determining that a quantity of transitions will be reduced if the set of data is inverted. Local DBI component 235 may also be configured to generate a control signal (a DBI signal) that indicates whether a corresponding set of data to be transmitted over bus 230 was inverted prior to being transmitted over bus 230 from local NAND controller 210. Local DBI component 235 may be configured to send the DBI indication to local logic 275.

Local buffer 255 may be configured to receive a WE/DBI signal over WE line 250. Local buffer 255 may be a tri-state buffer, and thus, an output of local buffer 255 may be configured in a floating state based on a voltage applied to a control line that is coupled with local buffer 255. In some examples, an output of local buffer 255 may be read by local DBI component 235 to determine whether data transmitted over bus 230 from NAND controller 205 was inverted prior to transmission. Local buffer 255 may also be used to transmit a WE/DBI signal over WE line 250 from local NAND controller 210. Thus, local buffer 255 may serve the purpose of an output buffer and an input buffer.

Local logic 275 may be configured to determine whether a received WE signal is being used for a reception enabling purpose or a DBI purpose. Local logic 275 may determine which purpose a received WE signal is being used for based on a CLE signal received over CLE line 270 and/or an ALE signal received over ALE line 285. Local logic 275 may be configured to select (e.g., using a multiplexer) whether a WE signal received over WE line 250 is to be used for a reception enable purpose or a DBI purpose. For example, local logic 275 may be configured to pass the WE signal to local controller 220 as a reception enable signal if a CLE or ALE signal is high And local logic 275 may be configured to pass the WE signal to local DBI component 235 as a DBI indication if the CLE and ALE signal are low. When used as a DBI indication, the WE signal may be configured to indicate that corresponding data has not been inverted when the WE signal is in a high state and that corresponding data has been inverted when the WE signal is in a low state—e.g., when the WE signal is a static high signal.

NAND interface 207 may include bus 230 and one or more control lines, including WE line 250, CLE line 270, ALE line 285.

Bus 230 may be configured to convey data and/or control information between NAND controller 205 and local NAND controller 210. In some examples, bus 230 include a single set of conductive lines that are used to serially convey control information and data. In other examples, bus 230 includes a first set of conductive lines that are used to convey control information and a second set of conductive lines that are used to convey data in parallel with the control information. Bus 230 may be composed of one or more conductive wires, conductive traces, or any combination thereof.

WE line 250 may be configured to convey a WE signal between NAND controller 205 and local NAND controller 210. WE line 250 may be composed of a conductive wire or a conductive trace. As suggested herein, a WE signal may be used to trigger local NAND controller 210 to receive and/or process control information on bus 230.

CLE line 270 may be configured to convey a CLE signal between NAND controller 205 and local NAND controller 210. CLE line 270 may be composed of a conductive wire or a conductive trace. As suggested herein, a CLE signal may be used to indicate that a command is present on bus 230.

ALE line 285 may be configured to convey an ALE signal between NAND controller 205 and local NAND controller 210. ALE line 285 may be composed of a conductive wire or a conductive trace. As suggested herein, an ALE signal may be used to indicate that a memory address is present on bus 230. WE line 250, CLE line 270, and ALE line 285 may be bundled together and with other control lines.

Figure 3:
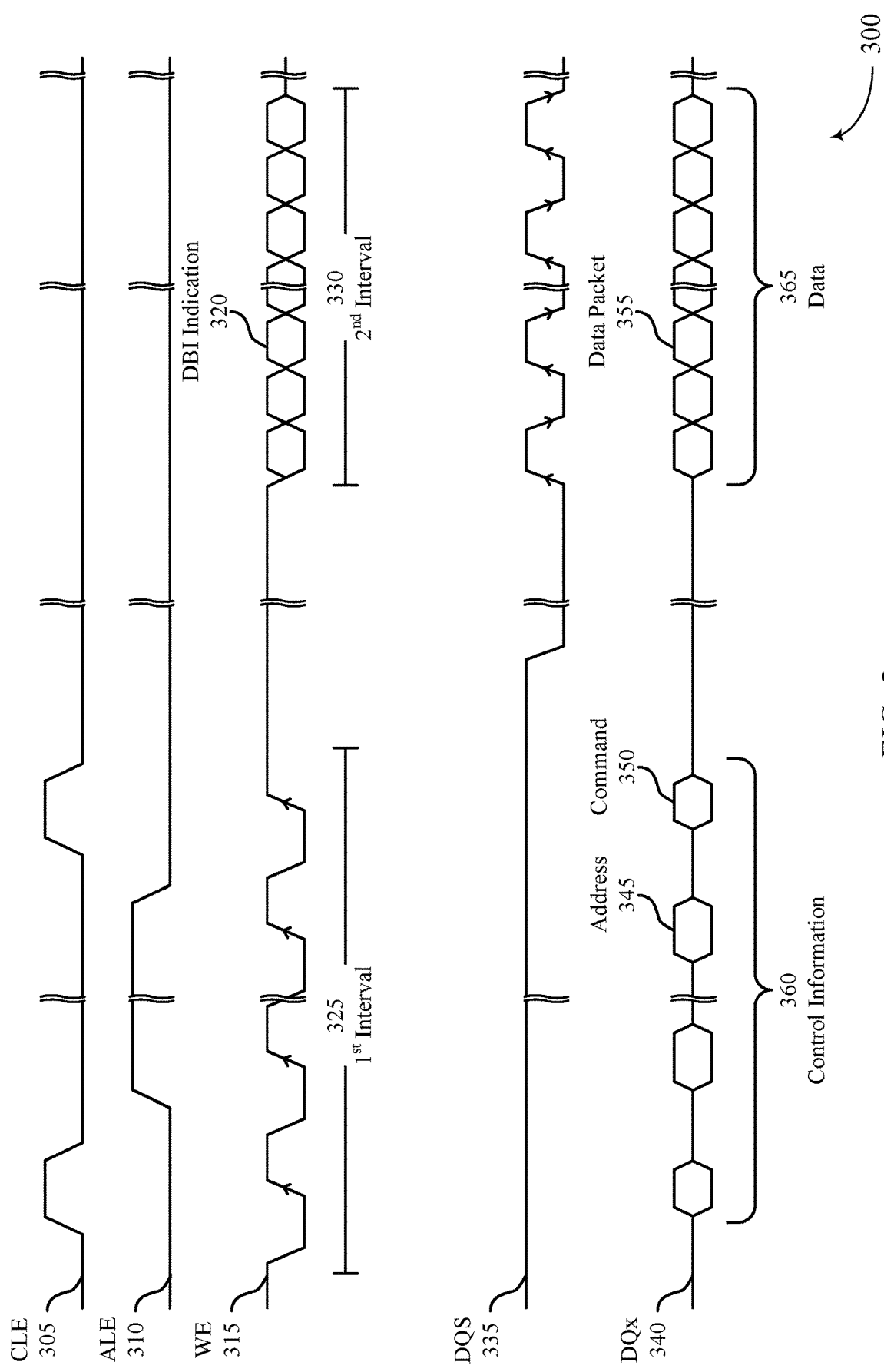
FIG. 3 illustrates an example of a signal diagram that supports signaling mechanism for bus inversion in accordance with examples as disclosed herein.

FIG. 3 illustrates an example of a signal diagram that supports signaling mechanism for bus inversion in accordance with examples as disclosed herein.

Signal diagram 300 may represent signals that are transmitted over an interface (e.g., NAND interface 207 of FIG. 2) within a memory system, such as memory system 200 of FIG. 2. Signal diagram 300 may include a representation of CLE signal 305, ALE signal 310, WE signal 315, DQS signal 335, and DQx signal 340.

CLE signal 305 may be configured to indicate that a command (e.g., command 350) is present on a bus (e.g., bus 230 of FIG. 2). CLE signal 305 may represent a signal that is transmitted over a CLE line (e.g., CLE line 270 of FIG. 2). A state of CLE signal 305 may be controlled by a system-level NAND controller.

ALE signal 310 may be configured to indicate that a memory address (e.g., memory address 345) is present on a bus. ALE signal 310 may represent a signal that is transmitted over an ALE line (e.g., ALE line 285 of FIG. 2). A state of ALE signal 310 may be controlled by a system-level NAND controller.

WE signal 315 may be configured to enable, at a local NAND controller (e.g., local NAND controller 210 of FIG. 2) the reception of a command or a memory address that is present on a bus during first interval 325. Control information 360 may be communicated by a system-level NAND controller over the bus during first interval 325. WE signal 315 may also be configured to indicate whether data that is present on the bus during second interval 330 was inverted prior to transmission. Data 365 may be communicated over the bus by a system-level NAND controller or a local NAND controller during second interval 330. A state of WE signal 315 may be controlled by a system-level NAND controller (e.g., during a data input process) or a local NAND controller (e.g., during a data output process).

DQS signal 335 may be configured to provide a clock for communicating different set of data over the bus during second interval 330. DQS signal 335 may be controlled by a system-level NAND controller (e.g., during a data input process) or a local NAND controller (e.g., during a data output process).

DQx signal 340 may represent data packets that are communicated over one or more data lines of the bus during second interval 330. DQx signal 340 may represent multiple, concurrent data signals, where each data signal may be associated with a respective bit of a set of data represented by the multiple data signals.

In some examples, a system-level NAND controller transmits a command (e.g., command 350) to a local NAND controller over a bus. In some examples, the command is a WR command requesting to store data in a memory device. The system-level NAND controller may also transition CLE signal 305 to a voltage level that indicates that a command is present on the bus. Additionally, the NAND controller may transition WE signal 315 from a first voltage level to a second voltage level.

The local NAND controller may determine that a command is present on the bus based on CLE signal 305 having the voltage level that indicates a command is present on the bus. Subsequently, the local NAND controller may process the command on the bus based on detecting a rising edge of WE signal 315. WE signal 315 may be based on a preliminary WE signal generated within the local NAND controller. Similarly, the system-level NAND controller may transmit a memory address to the local NAND controller over the bus, and the local NAND controller may process the memory address based on ALE signal 310 and WE signal 315.

After transmitting the WR command and memory address to the local NAND controller, the system-level NAND controller may process a set of data associated with the WR command. Processing the data may include providing the set of data to a DBI component (e.g., DBI component 225 of FIG. 2) that determines whether to invert the set of data prior to transmission of the data over the bus. The DBI component may determine that the data is to be inverted and may invert the set of data to obtain an inverted set of data that is used to represent the same data as the original set of data. After determining the data is to be inverted, the DBI component may transition a DBI signal generated by the DBI component indicating that the set of data was inverted. Alternatively, the DBI component may determine that the set of data is not to be inverted and may maintain the set of data in its original form. After determining the data is not to be inverted, the DBI component may maintain a DBI signal generated by the DBI component at a default level indicating that the set of data was not inverted.

The system-level NAND controller may then transmit the original or inverted set of data over the bus in combination with operating the DQS signal 335 as a clock for the data transmission during second interval 330. Additionally, the system-level NAND controller may adapt WE signal 315 based on the DBI signal generated by the DBI component during second interval 330. In some examples, the system-level NAND controller may adapt WE signal 315 based on combining the DBI signal with a preliminary WE signal generated at the system-level NAND controller. In some examples, if data packet 355 was inverted prior to transmission, WE signal 315 may be controlled so that corresponding DBI indication 320 indicates that data packet 355 was inverted—e.g., DBI indication 320 may have a high voltage. Alternatively, if data packet 355 was not inverted prior to transmission, WE signal 315 may be controlled so that corresponding DBI indication 320 indicates that data packet 355 was not inverted—e.g., DBI indication 320 may have a low voltage.

After processing the WR command and memory address, the local NAND controller may initiate a sequence of actions used to execute the programming (or write) operation; that is, to store the data on the bus at the memory cells associated with the memory address. Prior to storing the data received on the bus, the local NAND controller may detect logic values of corresponding DBI indications. In some cases, the local NAND controller determines that WE signal 315 is being used to convey DBI indications based on detecting that CLE signal 305 and ALE signal 310 have particular logic states—e.g., both CLE signal 305 and ALE signal 310 have low voltages. In such cases, after receiving data packet 355, a local DBI component (e.g., local DBI component 235 of FIG. 2) at the local NAND controller may determine a logic value represented by DBI indication 320. If the local DBI component determines that DBI indication 320 indicates that data packet 355 was inverted prior to being transmitted over the bus, the local DBI component may invert the data packet 355 prior to storage. Alternatively, if the local DBI component determines that DBI indication 320 indicates that data packet 355 was not inverted prior to being transmitted over the bus, the local DBI component may store the data packet 355 unchanged.

In an alternative option, the local NAND controller may refrain from (e.g., be incapable of) processing DBI indication 320 to determine whether data packet 355 was inverted. In such cases, the local NAND controller may store DBI indication 320 with data packet 355. In either case, the local NAND controller may configure a tri-state buffer (e.g., local buffer 255 of FIG. 2) that is coupled with a WE line used to convey WE signal 315 in a high-impedance state to give control of WE signal 315 to the system-level NAND controller.

In another example, the system-level NAND controller transmits a different command (e.g., command 350) to the local NAND controller over a bus. In some examples, the command is a RD command requesting data from a memory device. The system-level NAND controller may also transition CLE signal 305 to a voltage level that indicates that a command is present on the bus. Additionally, the system-level NAND controller may transition WE signal 315 from a first voltage level to a second voltage level.

The local NAND controller may determine that a command is present on the bus based on CLE signal 305 having the voltage level that indicates a command is present on the bus. Subsequently, the local NAND controller may process the command on the bus based on detecting a rising edge of WE signal 315. WE signal 315 may be based on a preliminary WE signal generated within the local NAND controller. Similarly, the system-level NAND controller may transmit a memory address to the local NAND controller over the bus, and the local NAND controller may process the memory address based on ALE signal 310 and WE signal 315.

After transmitting the RD command and memory address to the local NAND controller, the system-level NAND controller may configure a tri-state buffer (e.g., buffer 265 of FIG. 2) in a high impedance state to give control of WE signal 315 to the local NAND controller.

After processing the RD command and memory address, the local NAND controller may initiate a sequence of actions used to execute the read operation; that is, to provide, to the system-level NAND controller, data stored in the memory cells associated with the memory address. Before transmitting a set of data to the system-level NAND controller, the local NAND may process a set of data associated with the WR command. Processing the data may include providing the set of data to a local DBI component (e.g., local DBI component 235 of FIG. 2) that determines whether to invert the set of data prior to transmission of the data over the bus. The local DBI component may determine that the data is to be inverted and may invert the set of data to obtain an inverted set of data that is used to represent the same data as the original set of data. After determining the data is to be inverted, the local DBI component may transition a DBI signal generated by the local DBI component indicating that the set of data was inverted. Alternatively, the local DBI component may determine that the set of data is not to be inverted and may maintain the set of data in its original form. After determining the data is not to be inverted, the local DBI component may maintain a DBI signal generated by the local DBI component at a default level indicating that the set of data was not inverted.

In some examples, the set of data communicated to the system-level NAND controller may include a DBI indication that indicates whether the data packet was inverted when the system-level NAND controller transmitted the set of data to the local NAND controller. In such cases, the system-level NAND controller may determine whether the data packet received from the local NAND controller was inverted by the local DBI component based on a DBI indication received during second interval 330 and invert the set of data. Additionally, the system-level NAND controller may determine whether the uninverted set of data was previously inverted by the system-level NAND controller based on a DBI indication included in the set of data and may invert the remaining portion of the set of data.

In an alternative option, the local DBI component may determine whether to invert the set of data based on a DBI indication that was stored with the set of data. That is, the local DBI component may use the stored DBI indication to generate a DBI indication, where WE signal 315 may be based on the generated DBI indication. In some cases, the stored DBI indication is equivalent to the transmitted DBI indication.

The local NAND controller may then transmit the original or inverted set of data over the bus in combination with operating the DQS signal 335 as a clock for the data transmission during second interval 330. Additionally, the local NAND controller may adapt WE signal 315 based on the DBI signal generated by the local DBI component during second interval 330. For example, if data packet 355 was inverted prior to transmission, WE signal 315 may be controlled so that corresponding DBI indication 320 indicates that data packet 355 was inverted—e.g., DBI indication 320 may have a high voltage. Alternatively, if data packet 355 was not inverted prior to transmission, WE signal 315 may be controlled so that corresponding DBI indication 320 indicates that data packet 355 was not inverted—e.g., DBI indication 320 may have a low voltage.

Prior to outputting the data received on the bus, the system-level NAND controller may detect logic values of corresponding DBI indications. In some cases, the system-level NAND controller determines that WE signal 315 is being used to convey DBI indications based on detecting that a data output operation is being performed by the local NAND controller. In such cases, after receiving data packet 355, a DBI component (e.g., DBI component 225 of FIG. 2) at the system-level NAND controller may determine a logic value represented by DBI indication 320. If the DBI component determines that DBI indication 320 indicates that data packet 355 was inverted prior to being transmitted over the bus, the DBI component may invert the data packet 355 prior to outputting the set of data. Alternatively, if the DBI component determines that DBI indication 320 indicates that data packet 355 was not inverted prior to being transmitted over the bus, the DBI component may output the data packet 355 unchanged.

Although discussed in the context of repurposing WE signal 315, a DBI indication may similarly be indicated using a different control signal transmitted over an internal interface within a memory system. For example, a different control signal that is inactive during a data input or data output process may be used.

Figure 4:
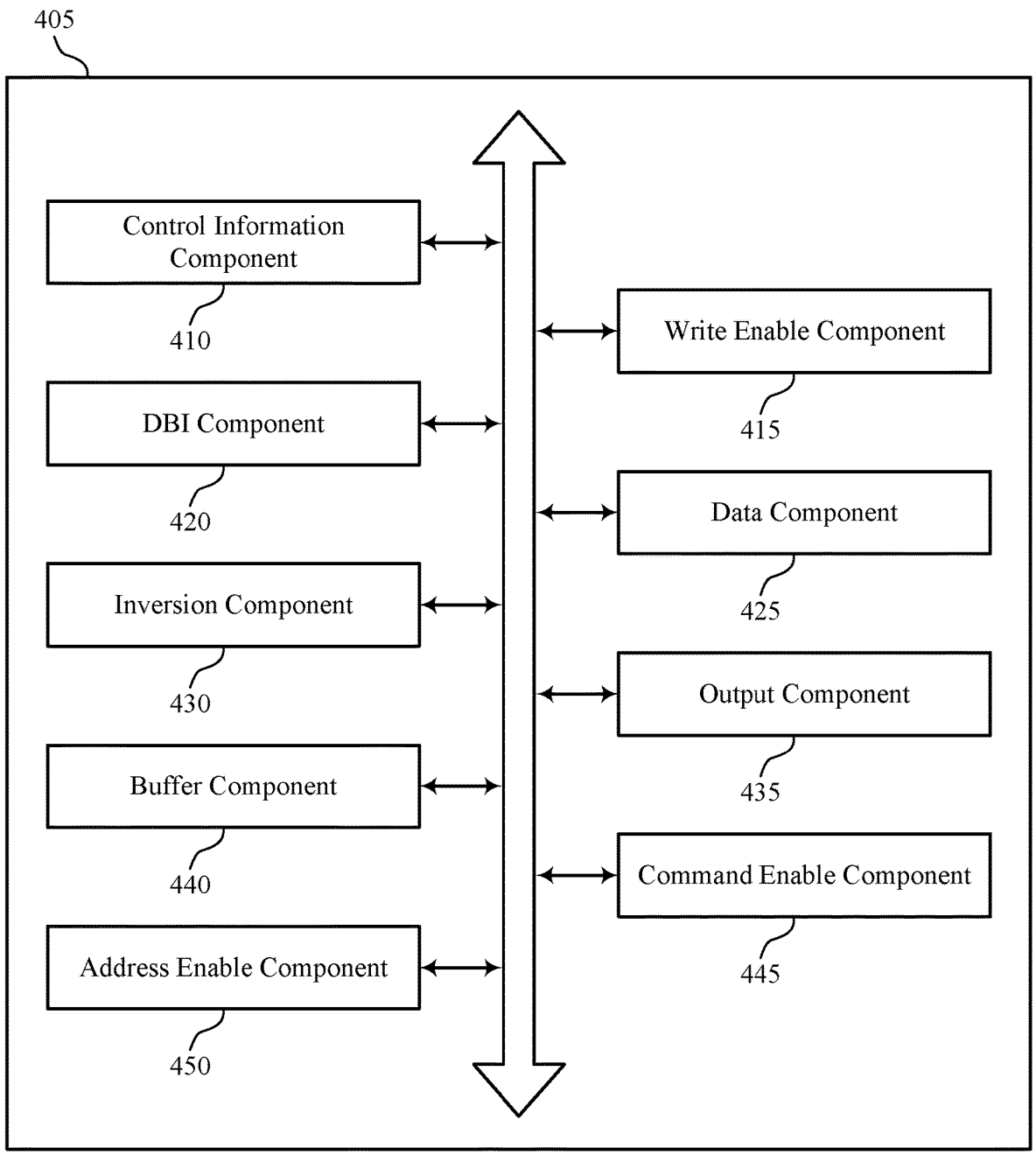
FIGS. 4 and 5 show block diagrams of memory controllers that support signaling mechanism for bus inversion in accordance with examples as disclosed herein.

FIG. 4 shows a block diagram 400 of a memory controller 405 that supports signaling mechanism for bus inversion in accordance with examples as disclosed herein. The memory controller 405 may be an example of aspects of a NAND controller as described with reference to FIGS. 1 and 2. The memory controller 405 may include a control information component 410, a write enable component 415, a DBI component 420, a data component 425, an inversion component 430, an output component 435, a buffer component 440, a command enable component 445, and an address enable component 450. Each of these modules may communicate, directly or indirectly, with one another (e.g., via one or more buses).

In some examples, the memory controller 405 is configured to perform a read operation in accordance with examples as disclosed herein. The control information component 410 may transmit a command to a memory device over a bus that is coupled with a controller and the memory device. The write enable component 415 may pulse a voltage of a control pin that is coupled with the controller and the memory device to enable reception of the command at the memory device. The DBI component 420 may detect, after the voltage of the control pin is pulsed, a voltage level of the control pin that indicates that corresponding data on the bus is in an inverted state. The data component 425 may receive, from the memory device, a set of data over the bus. The inversion component 430 may invert, based on the voltage level of the control pin, the set of data to obtain a corresponding set of data that is in an uninverted state. The output component 435 may output the corresponding set of data to a host system.

In some examples, the DBI component 420 may determine the set of data received from the memory device is in the inverted state based on the voltage level of the control pin.

In some examples, the control information component 410 may receive, from the host system, a request to read the corresponding set of data from the memory device. The control information component 410 may also generate the command and a memory address based on the request, where the command is a read command and the memory address is associated with memory cells in the memory device.

In some examples, the control information component 410 may transmit a second command to the memory device over the bus. In some examples, the write enable component 415 may pulse the voltage of the control pin a second time to enable reception of the second command at the memory device. In some examples, the DBI component 420 may detect, after the voltage of the control pin is pulsed the second time, a second voltage level of the control pin that indicates that corresponding data on the bus is in the uninverted state. In some examples, the data component 425 may receive, from the memory device, a second set of data over the bus. In some examples, the output component 435 may output the second set of data to the host system.

The buffer component 440 may configure the control pin in a floating state after the voltage of the control pin is pulsed.

In some examples, the memory controller 405 is configured to perform a write operation in accordance with examples as disclosed herein. The control information component 410 may transmit a command to a memory device over a bus that is coupled with a controller and the memory device. The write enable component 415 may pulse a voltage of a control pin that is coupled with the controller and the memory device to enable reception of the command at the memory device. The inversion component 430 may invert, based on a content of a set of data associated with the command, the set of data to obtain an inverted set of data. The DBI component 420 may set, after the voltage of the control pin is pulsed, the voltage of the control pin to a level that indicates that corresponding data on the bus is in an inverted state. The data component 425 may transmit, over the bus, the inverted set of data to the memory device based on the voltage of the control pin being set to the level.

In some examples, the write enable component 415 may transition the voltage of the control pin from a second level to the level. In some examples, the write enable component 415 may transition the voltage of the control pin from the level back to the second level.

In some examples, the DBI component 420 may transition the voltage of the control pin from the second level to the level based on the set of data being inverted.

The command enable component 445 may generate a first control signal for indicating a transmission of the command. The address enable component 450 may generate a second control signal for indicating a second transmission of a memory address associated with the command. In some examples, the write enable component 415 may generate a third control signal for enabling reception of the command and the memory address. In some examples, the DBI component 420 may generate a fourth control signal for indicating an inversion state of the inverted set of data. In some cases, the voltage of the control pin is pulsed and the voltage of the control pin is set to the level based on a combination of the third control signal and the fourth control signal.

In some examples, the data component 425 may receive, from a host system, the set of data and a request to store the set of data in the memory device. In some examples, the control information component 410 may generate the command and a memory address based on the request, where the command is a write command and the memory address is associated with memory cells in the memory device.

In some examples, the control information component 410 may transmit, to the memory device, a second command associated with a second set of data over the bus. In some examples, the write enable component 415 may pulse the voltage of the control pin a second time to enable reception of the second command at the memory device. In some examples, the DBI component 420 may set, based on a content of the second set of data and after the voltage of the control pin is pulsed the second time, the voltage of the control pin to a second level that indicates that corresponding data on the bus is in an uninverted state. In some examples, the data component 425 may transmitting, over the bus, the second set of data to the memory device based on the voltage of the control pin being set to the second level.

Figure 5:
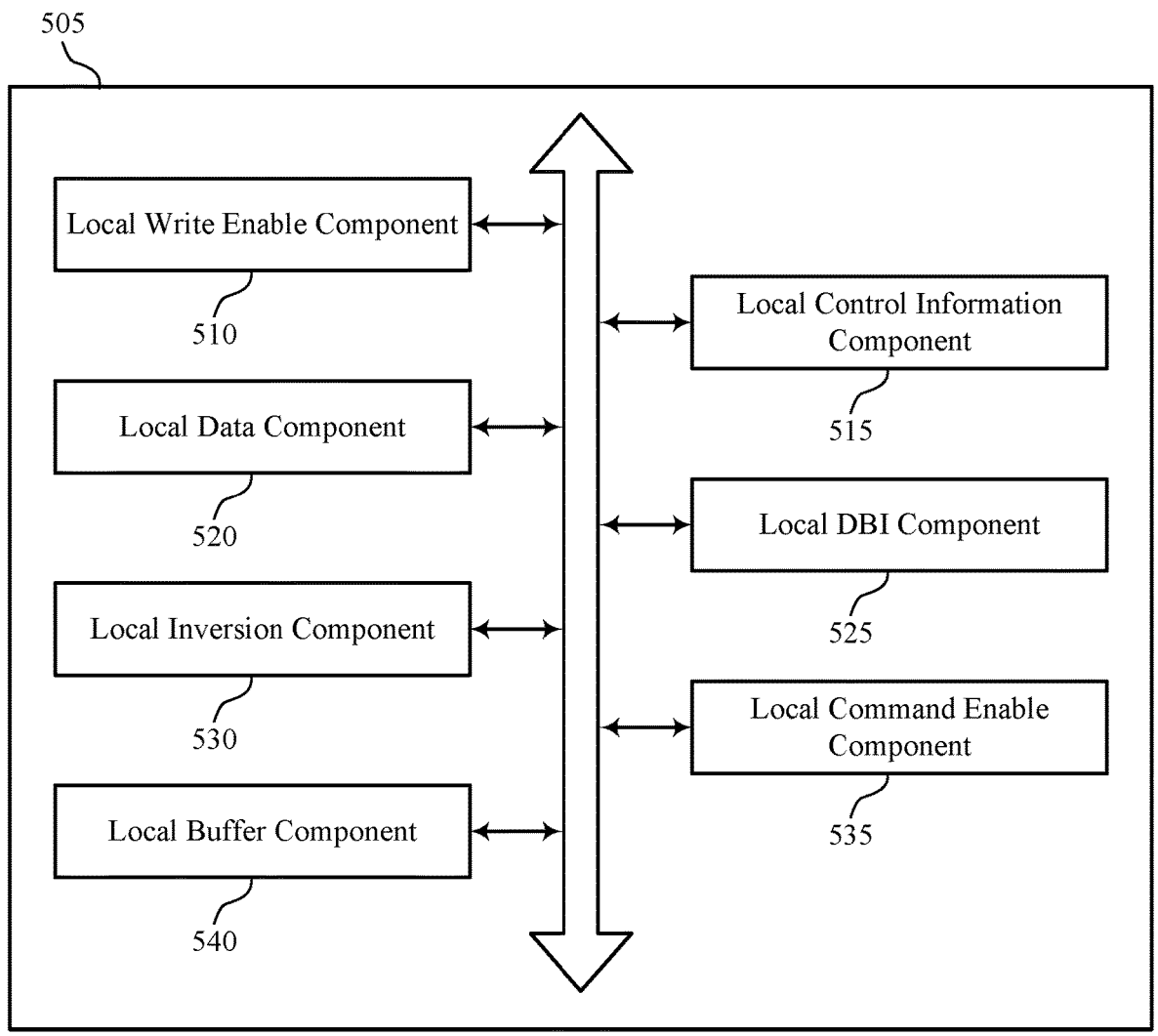

FIG. 5 shows a block diagram 500 of a memory controller 505 that supports signaling mechanism for bus inversion in accordance with examples as disclosed herein. The memory controller 505 may be an example of aspects of a local NAND controller as described with reference to FIGS. 1 and 2. The memory controller 505 may include a local write enable component 510, a local control information component 515, a local data component 520, a local DBI component 525, a local inversion component 530, a local command enable component 535, and a local buffer component 540. Each of these modules may communicate, directly or indirectly, with one another (e.g., via one or more buses).

In some examples, the memory controller 505 is configured to perform a read operation in accordance with examples as disclosed herein. The local write enable component 510 may detect a voltage pulse at a control pin that is coupled with a first controller and a second controller. The local control information component 515 may enable, based on the voltage pulse, a reception of a command over a bus that is coupled with the first controller and the second controller. The local data component 520 may retrieve, from a memory array that is coupled with the first controller, a set of data based on the command. The local DBI component 525 may set, after the set of data is retrieved, a voltage of the control pin to a level that indicates that corresponding data on the bus is in an inverted state.

The local inversion component 530 may invert, based on a content of the set of data, the set of data to obtain an inverted set of data. In some examples, the local data component 520 may transmit the inverted set of data over the bus.

In some examples, the local DBI component 525 may apply a second voltage having the level to the control pin based on the set of data being inverted.

In some examples, the local DBI component 525 may identify the set of data is in the inverted state based on an indication stored within the memory array. In some examples, the local DBI component 525 may set the voltage of the control pin to the level that indicates that corresponding data on the bus is in the inverted state based on the indication. In some examples, the local data component 520 may transmit the set of data over the bus.

In some examples, the local write enable component 510 may detect a second voltage pulse at the control pin. In some examples, the local control information component 515 may enable, based on the second voltage pulse, a reception of a second command over the bus. In some examples, the local data component 520 may retrieve, from the memory array, a second set of data based on the second command. In some examples, the local DBI component 525 may set, after the second set of data is retrieved, the voltage of the control pin to a second level that indicates that corresponding data on the bus is in an uninverted state. In some examples, the local data component 520 may transmit, to the second controller, the second set of data over the bus.

In some examples, the memory controller 505 is configured to perform a write operation in accordance with examples as disclosed herein. The local write enable component 510 may detect a voltage pulse at a control pin that is coupled with a first controller and a second controller. The local control information component 515 may enable, based on the voltage pulse, a reception of a command over a bus that is coupled with the first controller and the second controller. The local data component 520 may receive, from the second controller, a set of data associated with the command over the bus based on the command. The local DBI component 525 may detect, after the voltage pulse at the control pin is detected, a voltage level of the control pin that indicates that corresponding data on the bus is in an inverted state. The local data component 520 may also determine that the set of data is in the inverted state based on the voltage level of the control pin.

The local command enable component 535 may receive a first control signal that indicates transmission of the command, where the first controller is configured to receive the command based on a combination of the first control signal and the voltage pulse detected on the control pin.

The local inversion component 530 may invert the set of data to obtain a corresponding set of data based on the voltage level of the control pin. In some examples, the local data component 520 may store the corresponding set of data in a memory array. In some examples, the local data component 520 may store, in a memory array, the set of data and an indication of the inverted state.

In some examples, the local control information component 515 may receive the command and a memory address based on the reception of the command being enabled, where the command is a write command and the memory address is associated with memory cells in a memory array.

In some examples, the local write enable component 510 may detect a second voltage pulse at the control pin. In some examples, the local control information component 515 may enable, based on the second voltage pulse, a reception of a second command over the bus. In some examples, the local data component 520 may receive, from the second controller, a second set of data associated with the command over the bus based on the second command. In some examples, the local DBI component 525 may detect, after the second voltage pulse at the control pin is detected, a second voltage level of the control pin that indicates that corresponding data on the bus is in an uninverted state. In some examples, the local data component 520 may store the second set of data in a memory array.

The local buffer component 540 may configure the control pin in a floating state after the voltage pulse is detected.

Figure 6:
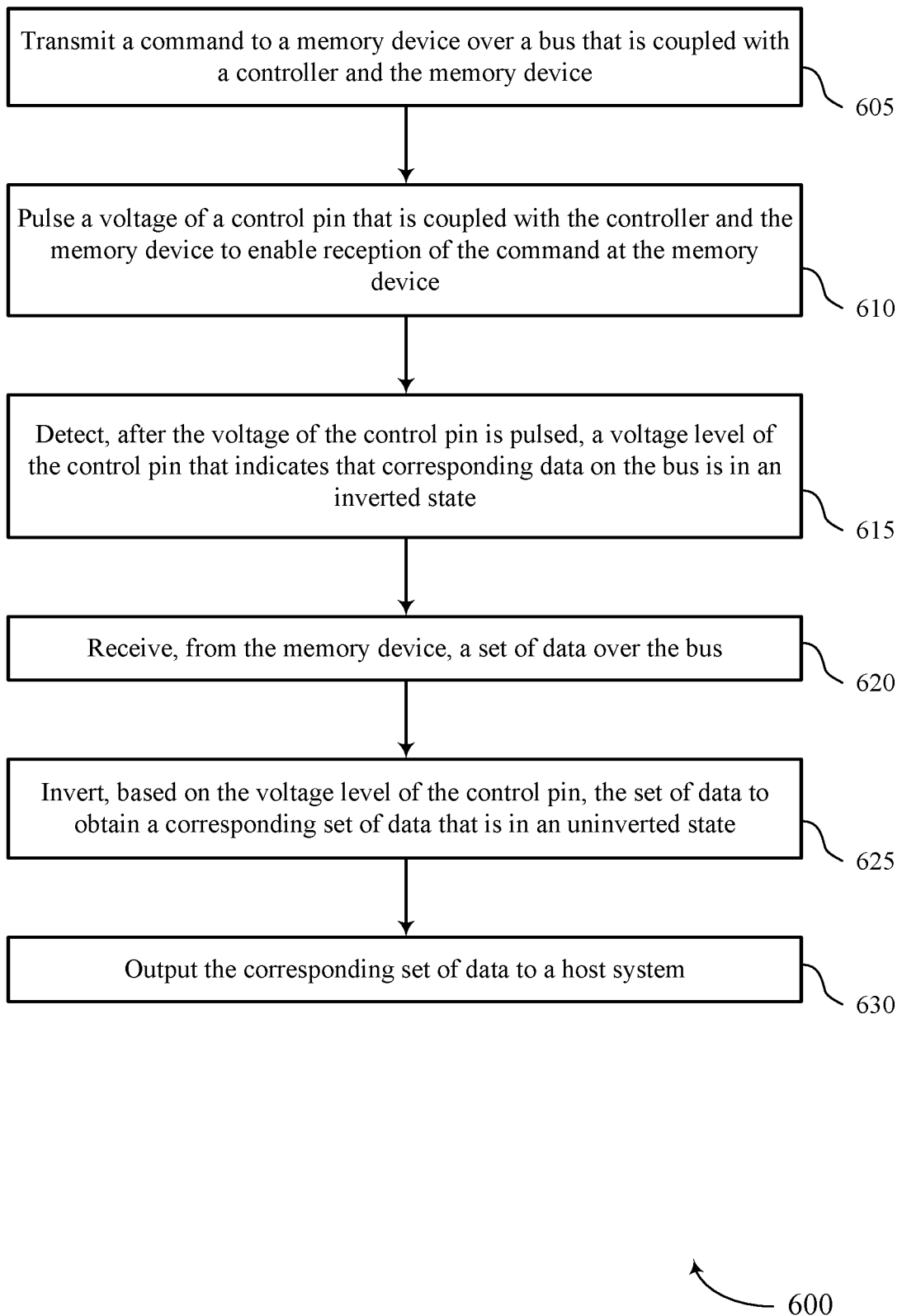
FIGS. 6 through 9 show flowcharts illustrating a method or methods that support signaling mechanism for bus inversion in accordance with examples as disclosed herein.

FIG. 6 shows a flowchart illustrating a method or methods 600 that supports signaling mechanism for bus inversion in accordance with examples as disclosed herein. The operations of method 600 may be implemented by a memory controller or its components as described herein. For example, the operations of method 600 may be performed by a memory controller as described with reference to FIG. 4. In some examples, a memory controller may execute a set of instructions to control the functional elements of the memory controller to perform the described functions. Additionally, or alternatively, a memory controller may perform aspects of the described functions using special-purpose hardware.

At 605, a command to a memory device over a bus that is coupled with a controller and the memory device may be transmitted (e.g., by the memory controller). The operations of 605 may be performed according to the methods described herein. In some examples, aspects of the operations of 605 may be performed by a control information component as described with reference to FIG. 4.

At 610, a voltage of a control pin that is coupled with the controller and the memory device to enable reception of the command at the memory device may be pulsed (e.g., by the memory controller). The operations of 610 may be performed according to the methods described herein. In some examples, aspects of the operations of 610 may be performed by a write enable component as described with reference to FIG. 4.

At 615, after the voltage of the control pin is pulsed, a voltage level of the control pin that indicates that corresponding data on the bus is in an inverted state may be detected (e.g., by the memory controller). The operations of 615 may be performed according to the methods described herein. In some examples, aspects of the operations of 615 may be performed by a DBI component as described with reference to FIG. 4.

At 620, a set of data over the bus may be received (e.g., by the memory controller) from the memory device. The operations of 620 may be performed according to the methods described herein. In some examples, aspects of the operations of 620 may be performed by a data component as described with reference to FIG. 4.

At 625, based on the voltage level of the control pin, the set of data may be inverted (e.g., by the memory controller) to obtain a corresponding set of data that is in an uninverted state. The operations of 625 may be performed according to the methods described herein. In some examples, aspects of the operations of 625 may be performed by an inversion component as described with reference to FIG. 4.

At 630, the corresponding set of data to a host system may be outputted (e.g., by the memory controller). The operations of 630 may be performed according to the methods described herein. In some examples, aspects of the operations of 630 may be performed by an output component as described with reference to FIG. 4.

In some examples, an apparatus as described herein may perform a method or methods, such as the method 600. The apparatus may include features, means, or instructions (e.g., a non-transitory computer-readable medium storing instructions executable by a processor) for transmitting a command to a memory device over a bus that is coupled with a controller and the memory device, pulsing a voltage of a control pin that is coupled with the controller and the memory device to enable reception of the command at the memory device, detecting, after the voltage of the control pin is pulsed, a voltage level of the control pin that indicates that corresponding data on the bus is in an inverted state, receiving, from the memory device, a set of data over the bus, inverting, based on the voltage level of the control pin, the set of data to obtain a corresponding set of data that is in an uninverted state, and outputting the corresponding set of data to a host system.

Some examples of the method 600 and the apparatus described herein may further include operations, features, means, or instructions for determining the set of data received from the memory device may be in the inverted state based on the voltage level of the control pin.

Some examples of the method 600 and the apparatus described herein may further include operations, features, means, or instructions for receiving, from the host system, a request to read the corresponding set of data from the memory device, and generating the command and a memory address based on the request, where the command may be a read command and the memory address may be associated with memory cells in the memory device.

Some examples of the method 600 and the apparatus described herein may further include operations, features, means, or instructions for transmitting a second command to the memory device over the bus, pulsing the voltage of the control pin a second time to enable reception of the second command at the memory device, detecting, after the voltage of the control pin may be pulsed the second time, a second voltage level of the control pin that indicates that corresponding data on the bus may be in the uninverted state, receiving, from the memory device, a second set of data over the bus, and outputting the second set of data to the host system.

Some examples of the method 600 and the apparatus described herein may further include operations, features, means, or instructions for configuring the control pin in a floating state after the voltage of the control pin may be pulsed.

Figure 7:
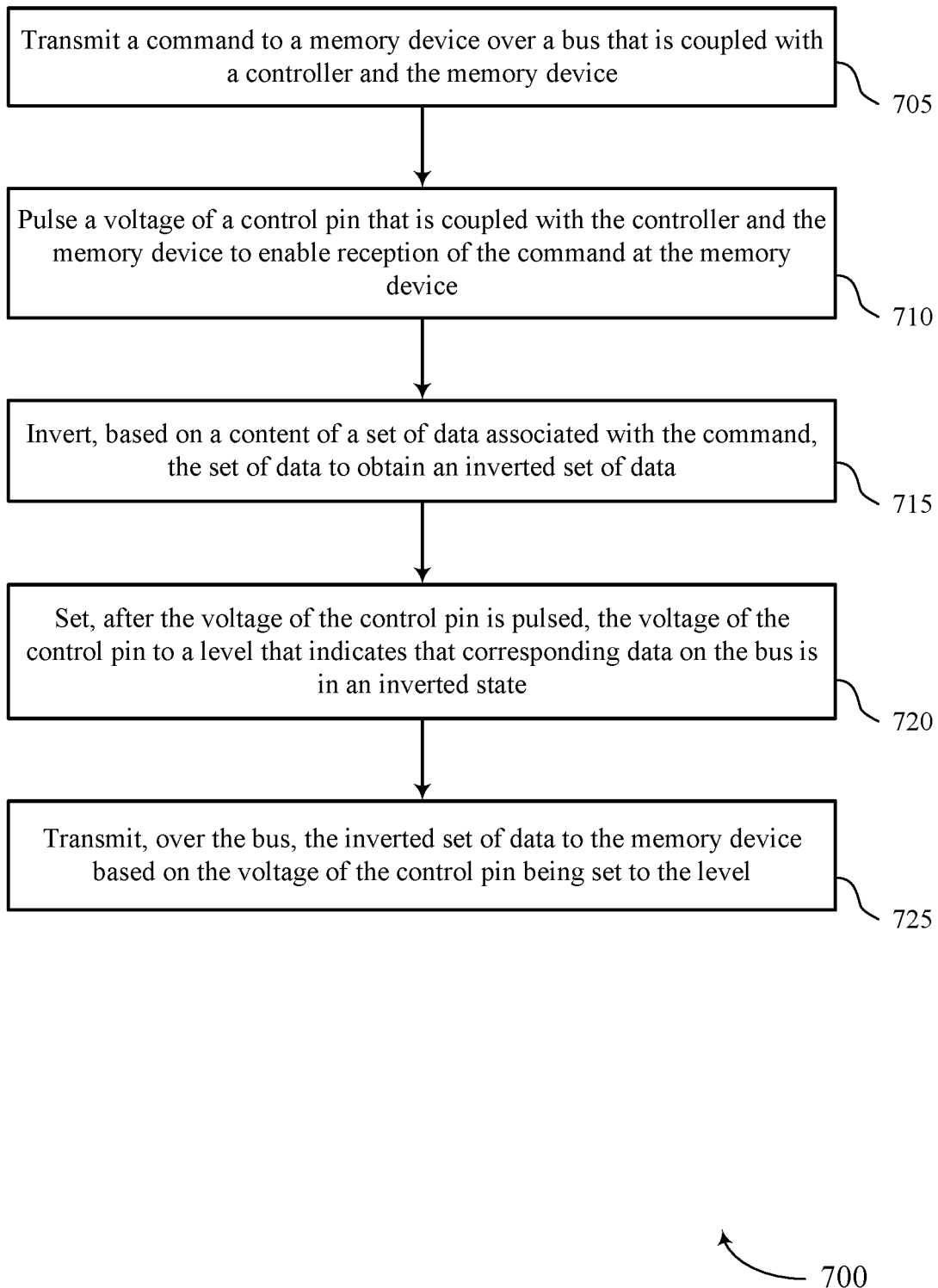

FIG. 7 shows a flowchart illustrating a method or methods 700 that supports signaling mechanism for bus inversion in accordance with examples as disclosed herein. The operations of method 700 may be implemented by a memory controller or its components as described herein. For example, the operations of method 700 may be performed by a memory controller as described with reference to FIG. 4. In some examples, a memory controller may execute a set of instructions to control the functional elements of the memory controller to perform the described functions. Additionally, or alternatively, a memory controller may perform aspects of the described functions using special-purpose hardware.

At 705, a command to a memory device over a bus that is coupled with a controller and the memory device may be transmitted (e.g., by the memory controller). The operations of 705 may be performed according to the methods described herein. In some examples, aspects of the operations of 705 may be performed by a control information component as described with reference to FIG. 4.

At 710, a voltage of a control pin that is coupled with the controller and the memory device to enable reception of the command at the memory device may be pulsed (e.g., by the memory controller). The operations of 710 may be performed according to the methods described herein. In some examples, aspects of the operations of 710 may be performed by a write enable component as described with reference to FIG. 4.

At 715, based on a content of a set of data associated with the command, the set of data to obtain an inverted set of data may be inverted (e.g., by the memory controller). The operations of 715 may be performed according to the methods described herein. In some examples, aspects of the operations of 715 may be performed by an inversion component as described with reference to FIG. 4.

At 720, after the voltage of the control pin is pulsed, the voltage of the control pin may be set (e.g., by the memory controller) to a level that indicates that corresponding data on the bus is in an inverted state. The operations of 720 may be performed according to the methods described herein. In some examples, aspects of the operations of 720 may be performed by a DBI component as described with reference to FIG. 4.

At 725, the inverted set of data to the memory device based on the voltage of the control pin being set to the level may be transmitted (e.g., by the memory controller) over the bus. The operations of 725 may be performed according to the methods described herein. In some examples, aspects of the operations of 725 may be performed by a data component as described with reference to FIG. 4.

In some examples, an apparatus as described herein may perform a method or methods, such as the method 700. The apparatus may include features, means, or instructions (e.g., a non-transitory computer-readable medium storing instructions executable by a processor) for transmitting a command to a memory device over a bus that is coupled with a controller and the memory device, pulsing a voltage of a control pin that is coupled with the controller and the memory device to enable reception of the command at the memory device, inverting, based on a content of a set of data associated with the command, the set of data to obtain an inverted set of data, setting, after the voltage of the control pin is pulsed, the voltage of the control pin to a level that indicates that corresponding data on the bus is in an inverted state, and transmitting, over the bus, the inverted set of data to the memory device based on the voltage of the control pin being set to the level.

In some examples of the method 700 and the apparatus described herein, pulsing the voltage of the control pin may include operations, features, means, or instructions for transitioning the voltage of the control pin from a second level to the level, and transitioning the voltage of the control pin from the level back to the second level.

In some examples of the method 700 and the apparatus described herein, setting the voltage of the control pin to the level may include operations, features, means, or instructions for transitioning the voltage of the control pin from the second level to the level based on the set of data being inverted.

Some examples of the method 700 and the apparatus described herein may further include operations, features, means, or instructions for generating a first control signal for indicating a transmission of the command, generating a second control signal for indicating a second transmission of a memory address associated with the command, generating a third control signal for enabling reception of the command and the memory address, and generating a fourth control signal for indicating an inversion state of the inverted set of data.

In some examples of the method 700 and the apparatus described herein, the voltage of the control pin may be pulsed and the voltage of the control pin may be set to the level based on a combination of the third control signal and the fourth control signal.

Some examples of the method 700 and the apparatus described herein may further include operations, features, means, or instructions for receiving, from a host system, the set of data and a request to store the set of data in the memory device, and generating the command and a memory address based on the request, where the command may be a write command and the memory address may be associated with memory cells in the memory device.

Some examples of the method 700 and the apparatus described herein may further include operations, features, means, or instructions for transmitting, to the memory device, a second command associated with a second set of data over the bus, pulsing the voltage of the control pin a second time to enable reception of the second command at the memory device, setting, based on a content of the second set of data and after the voltage of the control pin may be pulsed the second time, the voltage of the control pin to a second level that indicates that corresponding data on the bus may be in an uninverted state, and transmitting, over the bus, the second set of data to the memory device based on the voltage of the control pin being set to the second level.

Figure 8:
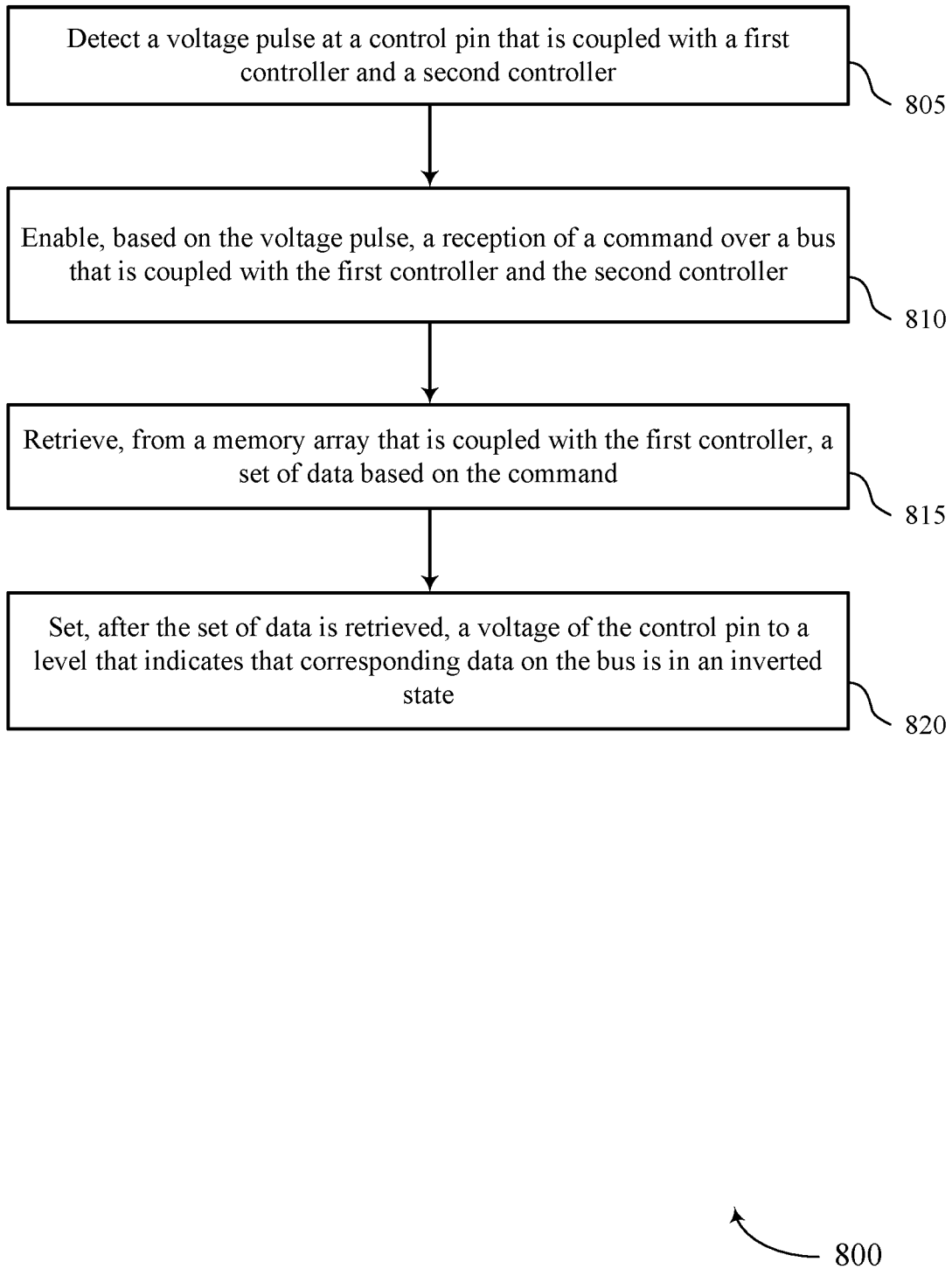

FIG. 8 shows a flowchart illustrating a method or methods 800 that supports signaling mechanism for bus inversion in accordance with examples as disclosed herein. The operations of method 800 may be implemented by a memory controller or its components as described herein. For example, the operations of method 800 may be performed by a memory controller as described with reference to FIG. 5. In some examples, a memory controller may execute a set of instructions to control the functional elements of the memory controller to perform the described functions. Additionally, or alternatively, a memory controller may perform aspects of the described functions using special-purpose hardware.

At 805, a voltage pulse at a control pin that is coupled with a first controller and a second controller may be detected (e.g., by the memory controller). The operations of 805 may be performed according to the methods described herein. In some examples, aspects of the operations of 805 may be performed by a local write enable component as described with reference to FIG. 5.

At 810, based on the voltage pulse, a reception of a command over a bus that is coupled with the first controller and the second controller may be enabled (e.g., by the memory controller). The operations of 810 may be performed according to the methods described herein. In some examples, aspects of the operations of 810 may be performed by a local control information component as described with reference to FIG. 5.

At 815, a set of data based on the command may be retrieved (e.g., by the memory controller) from a memory array that is coupled with the first controller. The operations of 815 may be performed according to the methods described herein. In some examples, aspects of the operations of 815 may be performed by a local data component as described with reference to FIG. 5.

At 820, after the set of data is retrieved, a voltage of the control pin may be set (e.g., by the memory controller) to a level that indicates that corresponding data on the bus is in an inverted state. The operations of 820 may be performed according to the methods described herein. In some examples, aspects of the operations of 820 may be performed by a local DBI component as described with reference to FIG. 5.

In some examples, an apparatus as described herein may perform a method or methods, such as the method 800. The apparatus may include features, means, or instructions (e.g., a non-transitory computer-readable medium storing instructions executable by a processor) for detecting a voltage pulse at a control pin that is coupled with a first controller and a second controller, enabling, based on the voltage pulse, a reception of a command over a bus that is coupled with the first controller and the second controller, retrieving, from a memory array that is coupled with the first controller, a set of data based on the command, and setting, after the set of data is retrieved, a voltage of the control pin to a level that indicates that corresponding data on the bus is in an inverted state.

Some examples of the method 800 and the apparatus described herein may further include operations, features, means, or instructions for inverting, based on a content of the set of data, the set of data to obtain an inverted set of data, and transmitting the inverted set of data over the bus.

In some examples of the method 800 and the apparatus described herein, setting the voltage of the control pin to the level may include operations, features, means, or instructions for applying a second voltage having the level to the control pin based on the set of data being inverted.

Some examples of the method 800 and the apparatus described herein may further include operations, features, means, or instructions for identifying the set of data may be in the inverted state based on an indication stored within the memory array, setting the voltage of the control pin to the level that indicates that corresponding data on the bus may be in the inverted state based on the indication, and transmitting the set of data over the bus.

Some examples of the method 800 and the apparatus described herein may further include operations, features, means, or instructions for receiving the command and a memory address based on the reception of the command being enabled, where the command may be a read command and the memory address may be associated with memory cells in the memory array.

Some examples of the method 800 and the apparatus described herein may further include operations, features, means, or instructions for detecting a second voltage pulse at the control pin, enabling, based on the second voltage pulse, a reception of a second command over the bus, retrieving, from the memory array, a second set of data based on the second command, setting, after the second set of data may be retrieved, the voltage of the control pin to a second level that indicates that corresponding data on the bus may be in an uninverted state, and transmitting, to the second controller, the second set of data over the bus.

Figure 9:
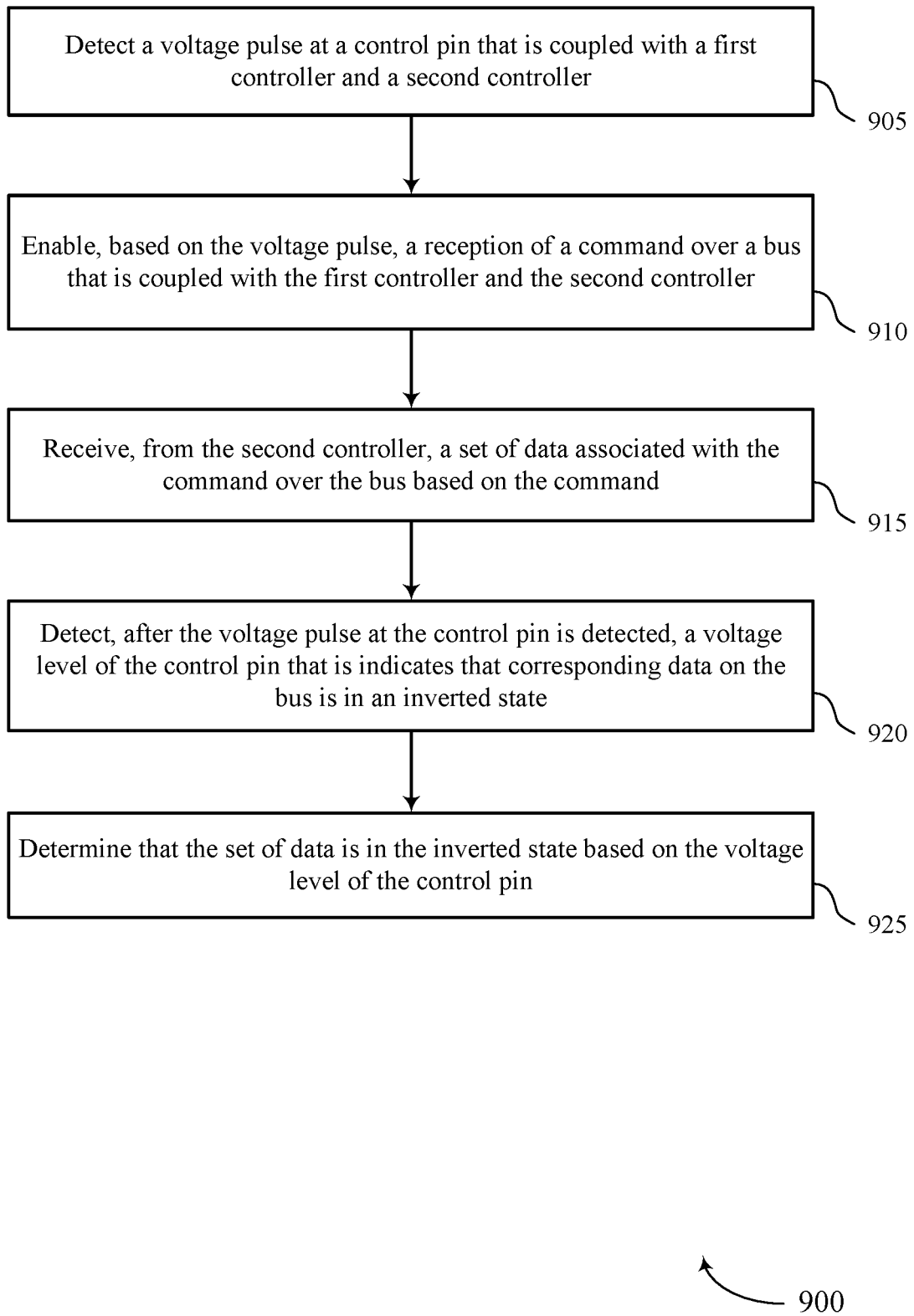

FIG. 9 shows a flowchart illustrating a method or methods 900 that supports signaling mechanism for bus inversion in accordance with examples as disclosed herein. The operations of method 900 may be implemented by a memory controller or its components as described herein. For example, the operations of method 900 may be performed by a memory controller as described with reference to FIG. 5. In some examples, a memory controller may execute a set of instructions to control the functional elements of the memory controller to perform the described functions. Additionally, or alternatively, a memory controller may perform aspects of the described functions using special-purpose hardware.

At 905, a voltage pulse at a control pin that is coupled with a first controller and a second controller may be detected (e.g., by the memory controller). The operations of 905 may be performed according to the methods described herein. In some examples, aspects of the operations of 905 may be performed by a local write enable component as described with reference to FIG. 5.

At 910, based on the voltage pulse, a reception of a command over a bus that is coupled with the first controller and the second controller may be enabled (e.g., by the memory controller). The operations of 910 may be performed according to the methods described herein. In some examples, aspects of the operations of 910 may be performed by a local control information component as described with reference to FIG. 5.

At 915, a set of data associated with the command may be received (e.g., by the memory controller) from the second controller over the bus based on the command. The operations of 915 may be performed according to the methods described herein. In some examples, aspects of the operations of 915 may be performed by a local data component as described with reference to FIG. 5.

At 920, after the voltage pulse at the control pin is detected, a voltage level of the control pin that indicates that corresponding data on the bus is in an inverted state may be detected (e.g., by the memory controller). The operations of 920 may be performed according to the methods described herein. In some examples, aspects of the operations of 920 may be performed by a local DBI component as described with reference to FIG. 5.

At 925, the set of data may be determined (e.g., by the memory controller) as being in the inverted state based on the voltage level of the control pin. The operations of 925 may be performed according to the methods described herein. In some examples, aspects of the operations of 925 may be performed by a local DBI component as described with reference to FIG. 5.

In some examples, an apparatus as described herein may perform a method or methods, such as the method 900. The apparatus may include features, means, or instructions (e.g., a non-transitory computer-readable medium storing instructions executable by a processor) for detecting a voltage pulse at a control pin that is coupled with a first controller and a second controller, enabling, based on the voltage pulse, a reception of a command over a bus that is coupled with the first controller and the second controller, receiving, from the second controller, a set of data associated with the command over the bus based on the command, detecting, after the voltage pulse at the control pin is detected, a voltage level of the control pin that indicates that corresponding data on the bus is in an inverted state, and determining that the set of data is in the inverted state based on the voltage level of the control pin.

Some examples of the method 900 and the apparatus described herein may further include operations, features, means, or instructions for receiving a first control signal that indicates transmission of the command, where the first controller may be configured to receive the command based on a combination of the first control signal and the voltage pulse detected on the control pin.

Some examples of the method 900 and the apparatus described herein may further include operations, features, means, or instructions for inverting the set of data to obtain a corresponding set of data based on the voltage level of the control pin, and storing the corresponding set of data in a memory array.

Some examples of the method 900 and the apparatus described herein may further include operations, features, means, or instructions for storing, in a memory array, the set of data and an indication of the inverted state.

Some examples of the method 900 and the apparatus described herein may further include operations, features, means, or instructions for receiving the command and a memory address based on the reception of the command being enabled, where the command may be a write command and the memory address may be associated with memory cells in a memory array.

Some examples of the method 900 and the apparatus described herein may further include operations, features, means, or instructions for detecting a second voltage pulse at the control pin, enabling, based on the second voltage pulse, a reception of a second command over the bus, receiving, from the second controller, a second set of data associated with the command over the bus based on the second command, detecting, after the second voltage pulse at the control pin may be detected, a second voltage level of the control pin that indicates that corresponding data on the bus may be in an uninverted state, and storing the second set of data in a memory array.

Some examples of the method 900 and the apparatus described herein may further include operations, features, means, or instructions for configuring the control pin in a floating state after the voltage pulse may be detected.

It should be noted that the methods described above describe possible implementations, and that the operations and the steps may be rearranged or otherwise modified and that other implementations are possible. Furthermore, portions from two or more of the methods may be combined.

An apparatus is described. The apparatus may include transmit a command to a memory device over a bus that is coupled with a controller and the memory device, pulse a voltage of a control pin that is coupled with the controller and the memory device to enable reception of the command at the memory device, detect, after the voltage of the control pin is pulsed, a voltage level of the control pin that indicates that corresponding data on the bus is in an inverted state, receive, from the memory device, a set of data over the bus, invert, based on the voltage level of the control pin, the set of data to obtain a corresponding set of data that is in an uninverted state, and output the corresponding set of data to a host system.

Some examples may further include determining the set of data received from the memory device may be in the inverted state based on the voltage level of the control pin.

Some examples may further include receiving, from the host system, a request to read the corresponding set of data from the memory device, and generate the command and a memory address based on the request, where the command may be a read command and the memory address may be associated with memory cells in the memory device.

Some examples may further include transmit a second command to the memory device over the bus, pulse the voltage of the control pin a second time to enable reception of the second command at the memory device, detect, after the voltage of the control pin may be pulsed the second time, a second voltage level of the control pin that indicates that corresponding data on the bus may be in the uninverted state, receive, from the memory device, a second set of data over the bus, and output the second set of data to the host system.

Some examples may further include configuring the control pin in a floating state after the voltage of the control pin may be pulsed.

An apparatus is described. The apparatus may include transmit a command to a memory device over a bus that is coupled with a controller and the memory device, pulse a voltage of a control pin that is coupled with the controller and the memory device to enable reception of the command at the memory device, invert, based on a content of a set of data associated with the command, the set of data to obtain an inverted set of data, set, after the voltage of the control pin is pulsed, the voltage of the control pin to a level that indicates that corresponding data on the bus is in an inverted state, and transmit, over the bus, the inverted set of data to the memory device based on the voltage of the control pin being set to the level.

Some examples may further include transition the voltage of the control pin from a second level to the level, and transition the voltage of the control pin from the level back to the second level.

Some examples may further include transition the voltage of the control pin from the second level to the level based on the set of data being inverted.

Some examples may further include generating a first control signal for indicating a transmission of the command, generate a second control signal for indicating a second transmission of a memory address associated with the command, generate a third control signal for enabling reception of the command and the memory address, and generate a fourth control signal for indicating an inversion state of the inverted set of data.

In some examples, the voltage of the control pin may be pulsed and the voltage of the control pin may be set to the level based on a combination of the third control signal and the fourth control signal.

Some examples may further include receiving, from a host system, the set of data and a request to store the set of data in the memory device, and generate the command and a memory address based on the request, where the command may be a write command and the memory address may be associated with memory cells in the memory device.

Some examples may further include transmit, to the memory device, a second command associated with a second set of data over the bus, pulse the voltage of the control pin a second time to enable reception of the second command at the memory device, set, based on a content of the second set of data and after the voltage of the control pin may be pulsed the second time, the voltage of the control pin to a second level that indicates that corresponding data on the bus may be in an uninverted state, and transmit, over the bus, the second set of data to the memory device based on the voltage of the control pin being set to the second level.

An apparatus is described. The apparatus may include detect a voltage pulse at a control pin that is coupled with a first controller and a second controller, enable, based on the voltage pulse, a reception of a command over a bus that is coupled with the first controller and the second controller, retrieve, from a memory array that is coupled with the first controller, a set of data based on the command, and set, after the set of data is retrieved, a voltage of the control pin to a level that indicates that corresponding data on the bus is in an inverted state.

Some examples may further include invert, based on a content of the set of data, the set of data to obtain an inverted set of data, and transmit the inverted set of data over the bus.

Some examples may further include apply a second voltage having the level to the control pin based on the set of data being inverted.

Some examples may further include identifying the set of data may be in the inverted state based on an indication stored within the memory array, set the voltage of the control pin to the level that indicates that corresponding data on the bus may be in the inverted state based on the indication, and transmit the set of data over the bus.

Some examples may further include receiving the command and a memory address based on the reception of the command being enabled, where the command may be a read command and the memory address may be associated with memory cells in the memory array.

Some examples may further include detect a second voltage pulse at the control pin, enable, based on the second voltage pulse, a reception of a second command over the bus, retrieve, from the memory array, a second set of data based on the second command, set, after the second set of data may be retrieved, the voltage of the control pin to a second level that indicates that corresponding data on the bus may be in an uninverted state, and transmit, to the second controller, the second set of data over the bus.

An apparatus is described. The apparatus may include detect a voltage pulse at a control pin that is coupled with a first controller and a second controller, enable, based on the voltage pulse, a reception of a command over a bus that is coupled with the first controller and the second controller, receive, from the second controller, a set of data associated with the command over the bus based on the command, detect, after the voltage pulse at the control pin is detected, a voltage level of the control pin that indicates that corresponding data on the bus is in an inverted state, and determine that the set of data is in the inverted state based on the voltage level of the control pin.

Some examples may further include receiving a first control signal that indicates transmission of the command, where the first controller may be configured to receive the command based on a combination of the first control signal and the voltage pulse detected on the control pin.

Some examples may further include invert the set of data to obtain a corresponding set of data based on the voltage level of the control pin, and store the corresponding set of data in a memory array.

Some examples may further include storing, in a memory array, the set of data and an indication of the inverted state.

Some examples may further include receiving the command and a memory address based on the reception of the command being enabled, where the command may be a write command and the memory address may be associated with memory cells in a memory array.

Some examples may further include detect a second voltage pulse at the control pin, enable, based on the second voltage pulse, a reception of a second command over the bus, receive, from the second controller, a second set of data associated with the command over the bus based on the second command, detect, after the second voltage pulse at the control pin may be detected, a second voltage level of the control pin that indicates that corresponding data on the bus may be in an uninverted state, and store the second set of data in a memory array.

Some examples may further include configuring the control pin in a floating state after the voltage pulse may be detected.

Information and signals described herein may be represented using any of a variety of different technologies and techniques. For example, data, instructions, commands, information, signals, bits, symbols, and chips that may be referenced throughout the above description may be represented by voltages, currents, electromagnetic waves, magnetic fields or particles, optical fields or particles, or any combination thereof. Some drawings may illustrate signals as a single signal; however, it will be understood by a person of ordinary skill in the art that the signal may represent a bus of signals, where the bus may have a variety of bit widths.

The terms "electronic communication," "conductive contact," "connected," and "coupled" may refer to a relationship between components that supports the flow of signals between the components. Components are considered in electronic communication with (or in conductive contact with or connected with or coupled with) one another if there is any conductive path between the components that can, at any time, support the flow of signals between the components. At any given time, the conductive path between components that are in electronic communication with each other (or in conductive contact with or connected with or coupled with) may be an open circuit or a closed circuit based on the operation of the device that includes the connected components. The conductive path between connected components may be a direct conductive path between the components or the conductive path between connected components may be an indirect conductive path that may include intermediate components, such as switches, transistors, or other components. In some examples, the flow of signals between the connected components may be interrupted for a time, for example, using one or more intermediate components such as switches or transistors.

The term "coupling" refers to condition of moving from an open-circuit relationship between components in which signals are not presently capable of being communicated between the components over a conductive path to a closed-circuit relationship between components in which signals are capable of being communicated between components over the conductive path. When a component, such as a controller, couples other components together, the component initiates a change that allows signals to flow between the other components over a conductive path that previously did not permit signals to flow.

The term "isolated" refers to a relationship between components in which signals are not presently capable of flowing between the components. Components are isolated from each other if there is an open circuit between them. For example, two components separated by a switch that is positioned between the components are isolated from each other when the switch is open. When a controller isolates two components, the controller affects a change that prevents signals from flowing between the components using a conductive path that previously permitted signals to flow.

The term "substantially" means that the modified characteristic (e.g., a verb or adjective modified by the term substantially) need not be absolute but is close enough to achieve the advantages of the characteristic.

The devices discussed herein, including a memory array, may be formed on a semiconductor substrate, such as silicon, germanium, silicon-germanium alloy, gallium arsenide, gallium nitride, etc. In some examples, the substrate is a semiconductor wafer. In other examples, the substrate may be a silicon-on-insulator (SOI) substrate, such as silicon-on-glass (SOG) or silicon-on-sapphire (SOP), or epitaxial layers of semiconductor materials on another substrate. The conductivity of the substrate, or sub-regions of the substrate, may be controlled through doping using various chemical species including, but not limited to, phosphorous, boron, or arsenic. Doping may be performed during the initial formation or growth of the substrate, by ion-implantation, or by any other doping means.

A switching component or a transistor discussed herein may represent a field-effect transistor (FET) and comprise a three terminal device including a source, drain, and gate. The terminals may be connected to other electronic elements through conductive materials, e.g., metals. The source and drain may be conductive and may comprise a heavily-doped, e.g., degenerate, semiconductor region. The source and drain may be separated by a lightly-doped semiconductor region or channel. If the channel is n-type (i.e., majority carriers are electrons), then the FET may be referred to as a n-type FET. If the channel is p-type (i.e., majority carriers are holes), then the FET may be referred to as a p-type FET. The channel may be capped by an insulating gate oxide. The channel conductivity may be controlled by applying a voltage to the gate. For example, applying a positive voltage or negative voltage to an n-type FET or a p-type FET, respectively, may result in the channel becoming conductive. A transistor may be "on" or "activated" when a voltage greater than or equal to the transistor's threshold voltage is applied to the transistor gate. The transistor may be "off" or "deactivated" when a voltage less than the transistor's threshold voltage is applied to the transistor gate.

The description set forth herein, in connection with the appended drawings, describes example configurations and does not represent all the examples that may be implemented or that are within the scope of the claims. The term "exemplary" used herein means "serving as an example, instance, or illustration," and not "preferred" or "advantageous over other examples." The detailed description includes specific details to providing an understanding of the described techniques. These techniques, however, may be practiced without these specific details. In some instances, well-known structures and devices are shown in block diagram form to avoid obscuring the concepts of the described examples.

In the appended figures, similar components or features may have the same reference label. Further, various components of the same type may be distinguished by following the reference label by a dash and a second label that distinguishes among the similar components. If just the first reference label is used in the specification, the description is applicable to any one of the similar components having the same first reference label irrespective of the second reference label.

Information and signals described herein may be represented using any of a variety of different technologies and techniques. For example, data, instructions, commands, information, signals, bits, symbols, and chips that may be referenced throughout the above description may be represented by voltages, currents, electromagnetic waves, magnetic fields or particles, optical fields or particles, or any combination thereof.

The various illustrative blocks and modules described in connection with the disclosure herein may be implemented or performed with a general-purpose processor, a DSP, an ASIC, an FPGA or other programmable logic device, discrete gate or transistor logic, discrete hardware components, or any combination thereof designed to perform the functions described herein. A general-purpose processor may be a microprocessor, but in the alternative, the processor may be any processor, controller, microcontroller, or state machine. A processor may also be implemented as a combination of computing devices (e.g., a combination of a DSP and a microprocessor, multiple microprocessors, one or more microprocessors in conjunction with a DSP core, or any other such configuration).

The functions described herein may be implemented in hardware, software executed by a processor, firmware, or any combination thereof. If implemented in software executed by a processor, the functions may be stored on or transmitted over as one or more instructions or code on a computer-readable medium. Other examples and implementations are within the scope of the disclosure and appended claims. For example, due to the nature of software, functions described above can be implemented using software executed by a processor, hardware, firmware, hardwiring, or combinations of any of these. Features implementing functions may also be physically located at various positions, including being distributed such that portions of functions are implemented at different physical locations. Also, as used herein, including in the claims, "or" as used in a list of items (for example, a list of items prefaced by a phrase such as "at least one of" or "one or more of") indicates an inclusive list such that, for example, a list of at least one of A, B, or C means A or B or C or AB or AC or BC or ABC (i.e., A and B and C). Also, as used herein, the phrase "based on" shall not be construed as a reference to a closed set of conditions. For example, an exemplary step that is described as "based on condition A" may be based on both a condition A and a condition B without departing from the scope of the present disclosure. In other words, as used herein, the phrase "based on" shall be construed in the same manner as the phrase "based at least in part on."

Computer-readable media includes both non-transitory computer storage media and communication media including any medium that facilitates transfer of a computer program from one place to another. A non-transitory storage medium may be any available medium that can be accessed by a general purpose or special purpose computer. By way of example, and not limitation, non-transitory computer-readable media can comprise RAM, ROM, electrically erasable programmable read only memory (EEPROM), compact disk (CD) ROM or other optical disk storage, magnetic disk storage or other magnetic storage devices, or any other non-transitory medium that can be used to carry or store desired program code means in the form of instructions or data structures and that can be accessed by a general-purpose or special-purpose computer, or a general-purpose or special-purpose processor. Also, any connection is properly termed a computer-readable medium. For example, if the software is transmitted from a website, server, or other remote source using a coaxial cable, fiber optic cable, twisted pair, digital subscriber line (DSL), or wireless technologies such as infrared, radio, and microwave, then the coaxial cable, fiber optic cable, twisted pair, digital subscriber line (DSL), or wireless technologies such as infrared, radio, and microwave are included in the definition of medium. Disk and disc, as used herein, include CD, laser disc, optical disc, digital versatile disc (DVD), floppy disk and Blu-ray disc where disks usually reproduce data magnetically, while discs reproduce data optically with lasers. Combinations of the above are also included within the scope of computer-readable media.

The description herein is provided to enable a person skilled in the art to make or use the disclosure. Various modifications to the disclosure will be apparent to those skilled in the art, and the generic principles defined herein may be applied to other variations without departing from the scope of the disclosure. Thus, the disclosure is not limited to the examples and designs described herein, but is to be accorded the broadest scope consistent with the principles and novel features disclosed herein.

What is claimed is:

1. An apparatus, comprising:
a controller configured to transmit a command to a memory device via a bus;
a buffer configured to transmit, to the memory device, a signal enabling reception of the command at the memory device via a control line; and
an inversion circuit configured to:
  detect, after a transmission of the signal, a voltage level of the control line indicating whether a set of data on the bus is in an inverted state,
  obtain the set of data from the bus, and
  invert the set of data to obtain corresponding uninverted data based at least in part on the voltage level of the control line indicating that the set of data is in the inverted state.

2. The apparatus of claim 1, wherein the controller is further configured to:
output, after inverting the set of data, the corresponding uninverted data to a host system.

3. The apparatus of claim 1, wherein the buffer is further configured to:
pulse a control pin coupled with the control line to transmit the signal enabling reception of the command.

4. The apparatus of claim 1, wherein the inversion circuit is further configured to:
determine the set of data received from the memory device is in the inverted state based at least in part on the voltage level of the control line indicating that the set of data is in the inverted state.

5. The apparatus of claim 1, wherein the controller is further configured to:
receive, from a host system, a request to read the set of data from the memory device; and
generate the command and a memory address based at least in part on the request, wherein the command is a read command and the memory address is associated with memory cells in the memory device.

6. The apparatus of claim 1, wherein:
the controller is further configured to transmit a second command to the memory device via the bus,
the buffer is further configured to transmit, to the memory device, a second signal enabling reception of the second command at the memory device,
the inversion circuit is further configured to detect, after a transmission of the second signal, a second voltage level of the control line indicating that corresponding data on the bus is in an uninverted state, and the controller is further configured to:
obtain, from the bus, a second set of data associated with the second command, and
output the second set of data to a host system based at least in part on the voltage level of the control line indicating that the set of data is in the uninverted state.

7. The apparatus of claim 1, wherein the controller is further configured to:
configure an output of the buffer to be in a floating state after the transmission of the signal enabling reception of the command at the memory device.

8. The apparatus of claim 1, wherein the controller and the memory device are both included in a memory system.

9. The apparatus of claim 1, wherein the buffer is a tri-state buffer.

10. An apparatus, comprising:
a controller configured to transmit a command to a memory device via a bus;
a buffer configured to transmit, to the memory device, a first signal enabling reception of the command at the memory device via a control line; and
an inversion circuit configured to:
invert, based at least in part on a content of a set of data associated with the command, the set of data to put the set of data into an inverted state, and
apply, to logic based at least in part on inverting the set of data, a second signal indicating that the set of data is in the inverted state,
wherein the logic is configured to apply, based at least in part on the second signal, a voltage level to the buffer, the voltage level indicating that the set of data is in the inverted state, and
wherein the inversion circuit is further configured to transmit, after inversion of the set of data, the set of data to the memory device via the bus.

11. The apparatus of claim 10, wherein the buffer is further configured to:
apply, to the control line, the voltage level based at least in part on receiving the voltage level from the logic.

12. The apparatus of claim 10, wherein the buffer is further configured to:
pulse a control pin coupled with the control line to transmit the first signal enabling reception of the command, wherein the voltage level of the control line is detected after the control pin is pulsed.

13. The apparatus of claim 10, wherein:
the controller is further configured to transmit, to the memory device via the bus, an address associated with the command; and
the apparatus further comprises a signal generator configured to generate a control signal for indicating a transmission of the address associated with the command.

14. The apparatus of claim 10, further comprising:
a first signal generator configured to generate a first control signal associated with enabling reception of the command; and
a second signal generator configured to generate a second control signal for indicating a transmission of the command,
wherein the logic is further configured to generate the first signal enabling reception of the command based at least in part on the first control signal and the second control signal, wherein the buffer is further configured to receive the first signal enabling reception of the command from the logic before a transmission of the second signal to the memory device.

15. The apparatus of claim 10, wherein the controller is further configured to:
receive, from a host system, the set of data and a request to store the set of data in the memory device; and
generate the command based at least in part on the request, wherein the command is a write command.

16. The apparatus of claim 10, wherein:
the controller is further configured to transmit a second command to the memory device via the bus,
the buffer is further configured to:
transmit, to the memory device, a third signal enabling reception of the second command at the memory device via the control line, and
apply, based at least in part on a content of a second set of data associated with the second command, a second voltage to the control line indicating that the second set of data is in an uninverted state, and
the controller is further configured to transmit the second set of data to the memory device via the bus.

17. The apparatus of claim 10, wherein:
the controller and the memory device are both included in a memory system.

18. An apparatus, comprising:
a memory array;
logic configured to receive, from a first controller, a signal enabling reception of a command via a control line;
a second controller configured to:
receive, based at least in part on the signal, the command via a bus that is coupled with the first controller and the second controller, and
retrieve, based at least in part on the command, a set of data from the memory array; and
an inversion circuit configured to apply, to the control line and based at least in part on a content of the set of data, a voltage indicating whether the set of data is in an inverted state.

19. The apparatus of claim 18, wherein the inversion circuit is further configured to:
invert, based at least in part on the content of the set of data, the set of data to obtain an inverted set of data; and
transmit the inverted set of data over the bus.

20. The apparatus of claim 18, wherein the logic is further configured to:
detect a pulse at a control pin that is coupled with the control line to detect the signal enabling reception of the command.

* * * * *